(12) United States Patent
Luo et al.

(10) Patent No.: US 11,637,178 B2
(45) Date of Patent: Apr. 25, 2023

(54) MICROELECTRONIC DEVICES INCLUDING ISOLATION STRUCTURES NEIGHBORING STAIRCASE STRUCTURES, AND RELATED MEMORY DEVICES, ELECTRONIC SYSTEMS, AND METHODS

(71) Applicant: Micron Technology, Inc., Boise, ID (US)

(72) Inventors: Shuangqiang Luo, Boise, ID (US); Indra V. Chary, Boise, ID (US); Harsh Narendrakumar Jain, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 17/078,755

(22) Filed: Oct. 23, 2020

(65) Prior Publication Data
US 2022/0130954 A1  Apr. 28, 2022

(51) Int. Cl.
*H01L 29/06* (2006.01)
*H01L 23/522* (2006.01)
(Continued)

(52) U.S. Cl.
CPC ...... *H01L 29/0649* (2013.01); *H01L 23/5226* (2013.01); *H01L 27/1157* (2013.01);
(Continued)

(58) Field of Classification Search
CPC ............ H01L 29/0649; H01L 23/5226; H01L 23/53295; H01L 27/11519;
(Continued)

(56) References Cited

U.S. PATENT DOCUMENTS 9,064,576 B2  6/2015  Tanzawa
9,941,209 B2  4/2018  Tessariol et al.
(Continued)

FOREIGN PATENT DOCUMENTS

KR  10-2010-0021981 A  2/2010

OTHER PUBLICATIONS

Luo et al., U.S. Appl. No. 16/799,543 titled Microelectronic Devices Including Staircase Structures, and Related Memory Devices, Electronic Systems, and Methods filed Feb. 24, 2020.
(Continued)

*Primary Examiner* — Calvin Y Choi
(74) *Attorney, Agent, or Firm* — TraskBritt

(57) ABSTRACT

A microelectronic device comprises a stack structure comprising a vertically alternating sequence of conductive structures and insulative structures arranged in tiers, a staircase structure within the stack structure having steps comprising horizontal edges of the tiers, a first insulative material vertically overlying the staircase structure, conductive contact structures comprising a conductive material extending through the first insulative material and in contact with the steps of the staircase structure, and a second insulative material extending in a first horizontal direction between horizontally neighboring conductive contact structures and
(Continued)

exhibiting one or more different properties than the first insulative material. Related microelectronic devices, electronic systems, and methods are also described.

25 Claims, 18 Drawing Sheets

(51) Int. Cl.
H01L 27/11519 (2017.01)
H01L 27/11524 (2017.01)
H01L 27/11556 (2017.01)
H01L 27/1157 (2017.01)
H01L 27/11582 (2017.01)
H01L 27/11565 (2017.01)

(52) U.S. Cl.
CPC .. *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ......... H01L 27/11524; H01L 27/11556; H01L 27/11565; H01L 27/1157; H01L 27/11582; H01L 27/11548; H01L 27/11575

See application file for complete search history.

(56) References Cited

U.S. PATENT DOCUMENTS

| | | |
|---|---|---|
| 10,141,330 B1 | 11/2018 | Lindsay et al. |
| 10,269,626 B2 | 4/2019 | Ha et al. |
| 10,381,080 B2 | 8/2019 | Pan et al. |
| 10,580,795 B1 | 3/2020 | Luo et al. |
| 2011/0316063 A1 | 12/2011 | Tang et al. |
| 2016/0293621 A1 | 10/2016 | Huang et al. |
| 2016/0343727 A1* | 11/2016 | Kim .................... H01L 27/1157 |
| 2020/0035694 A1 | 1/2020 | Kaminaga |
| 2020/0243498 A1* | 7/2020 | Zhang ................. H01L 25/0657 |

OTHER PUBLICATIONS

Luo et al., U.S. Appl. No. 168/667,704 titled Microelectronic Devices Including Staircase Structures, and Related Memory Devices and Electronic Systems, filed Oct. 29, 2019.

International Search Report for Application No. PCT/US2021/050177, dated Jan. 4, 2022, 4 pages.

Written Opinion of the International Searching Authority for Application No. PCT/US2021/050177, dated Jan. 4, 2022, 5 pages.

Taiwanese Search Report and Office Action from Taiwanese Application No. 110136654, dated Jul. 8, 2022, 9 pages with English translation.

* cited by examiner

US 11,637,178 B2

MICROELECTRONIC DEVICES INCLUDING ISOLATION STRUCTURES NEIGHBORING STAIRCASE STRUCTURES, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices, and related electronic systems and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include additional tiers of conductive structures and, hence, additional staircase structures and/or additional steps in individual staircase structures associated therewith. However, increasing the quantity of tiers of conductive structures (and hence, the quantity of staircase structures and/or the quantity of steps in individual staircase structures) of a stack structure without undesirably increasing the overall width (e.g., lateral footprint) of the stack structure can result in undesirably complex and congested routing paths to electrically connect the conductive structures to additional components (e.g., string drivers) of the memory device. In addition, as the height of the stack structure has increased to provide additional memory density, insulative materials overlying the staircase structures exhibit one or more voids due to the high aspect ratio of the staircase structures and the method by which the insulative materials are formed over the staircase structures. However, such voids may result in insufficient electrical isolation between one or more components of the vertical memory array.

DETAILED DESCRIPTION

Figure 1A:
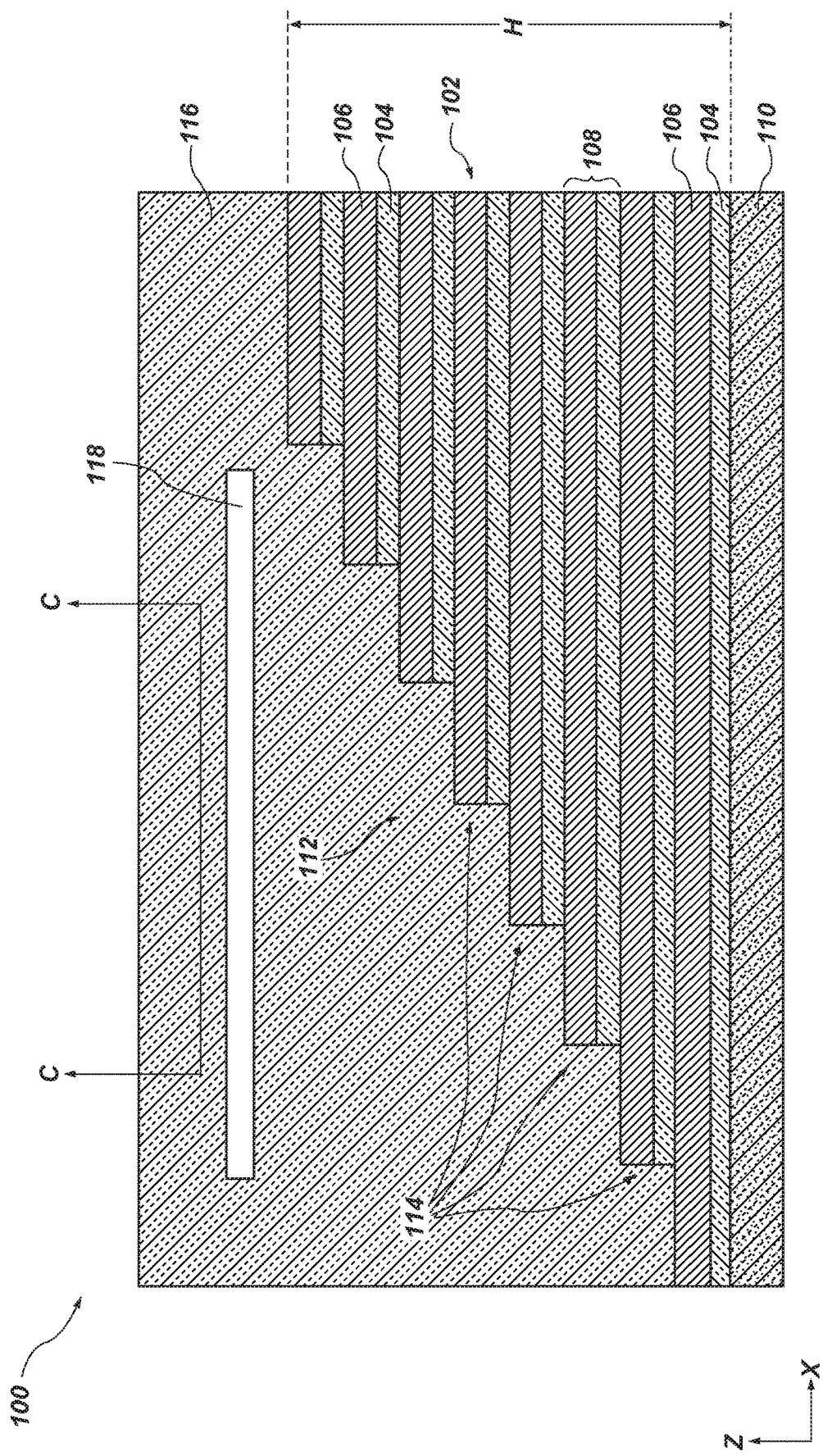
FIG. 1A through FIG. 1J are simplified cross-sectional views (FIG. 1A, FIG. 1B, FIG. 1D, FIG. 1F, FIG. 1H, and FIG. 1J) and top-down views (FIG. 1C, FIG. 1E, FIG. 1G, and FIG. 1I) illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device structure or microelectronic device (e.g., a memory device, such as a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device structure includes a stack structure comprising vertically alternating conductive structures and insulative structures arranged in tiers. A staircase structure may be defined within the stack structure and may include steps comprising edges of at least some of the tiers. A first insulative material may overlie the staircase structure. Conductive contact structures may extend through the first insulative material and may be electrically connected to the steps of the staircase structure. The conductive contact structures may be spaced from each other in a first horizontal direction. Support pillar structures may extend through the staircase structure and may be horizontally offset in the first horizontal direction and a second horizontal direction from the conductive contact structures. Isolation structures may vertically extend at least partially into the first insulative material between horizontally neighboring conductive contact structures. The isolation structures may comprise a second insulative material exhibiting one or more different properties than the first insulative material. The second insulative material may further extend in the first horizontal direction at least partially between the insulative structures and the horizontally neighboring conductive contact structures. The isolation structures and the second insulative material may facilitate electrical isolation of horizontally neighboring conductive contact structures. In some embodiments, the second insulative material extends in the second horizontal direction between horizontally neighboring support pillar structures. The second insulative material may extend at least partially into the horizontally neighboring support pillar structures such that the support pillar structures neighboring the second insulative material comprise an upper dimension (e.g., a diameter) less than the corresponding dimension of a lower portion of the support pillar structures.

The microelectronic device structure may be formed by forming a preliminary stack structure comprising tiers of vertically alternating insulative structures and sacrificial structures (e.g., additional insulative structures exhibiting an etch selectivity with respect to the insulative structures). A staircase structure including steps defined at horizontal edges of the tiers of the insulative structures and sacrificial structures may be formed within the stack structure. A first insulative material may be formed over the staircase structure. Support pillar structures (at least some of which may comprise a conductive structure extending through the staircase structure) may be formed through the first insulative material and the staircase structure. In some embodiments, due to the method of formation of the first insulative material and the aspect ratio of the first insulative material, the first insulative material may include seams (gaps, voids) therein. In some embodiments, the seam extends in the first horizontal direction. Slots may be formed through the stack structure and the sacrificial structures may be removed (e.g., exhumed) through so-called "replacement gate" or "gate last" processing acts to form a stack structure comprising a vertically alternating sequence of the insulative structures and conductive structures arranged in tiers. Trenches (e.g., openings) may be formed through the stack structure to expose portions of the seam within the first insulative material. The trenches and at least a portion of the seam may be filled with a second insulative material exhibiting one or more different properties than the first insulative material to form isolation structures and at least partially fill the seam with the second insulative material. Openings may be formed through the second insulative material or the remaining portions of the seam and through the first insulative material to expose the conductive structure of each step. Conductive contact structures may be formed within the openings, each conductive contact structure in electrical communication with a conductive structure of a step of the staircase structure. The isolation structures and the second insulative material within at least a portion of the seam may reduce or prevent electrical shorting between horizontally neighboring conductive contact structures.

FIG. 1A through FIG. 1J illustrate a method of forming a microelectronic device structure 100, in accordance with embodiments of the disclosure. With the description provided below, it will be readily apparent to one of ordinary skill in the art that the methods and structures described herein with reference to FIG. 1A through FIG. 1J may be used in the formation and configuration of various devices and electronic systems.

Figure 1B:
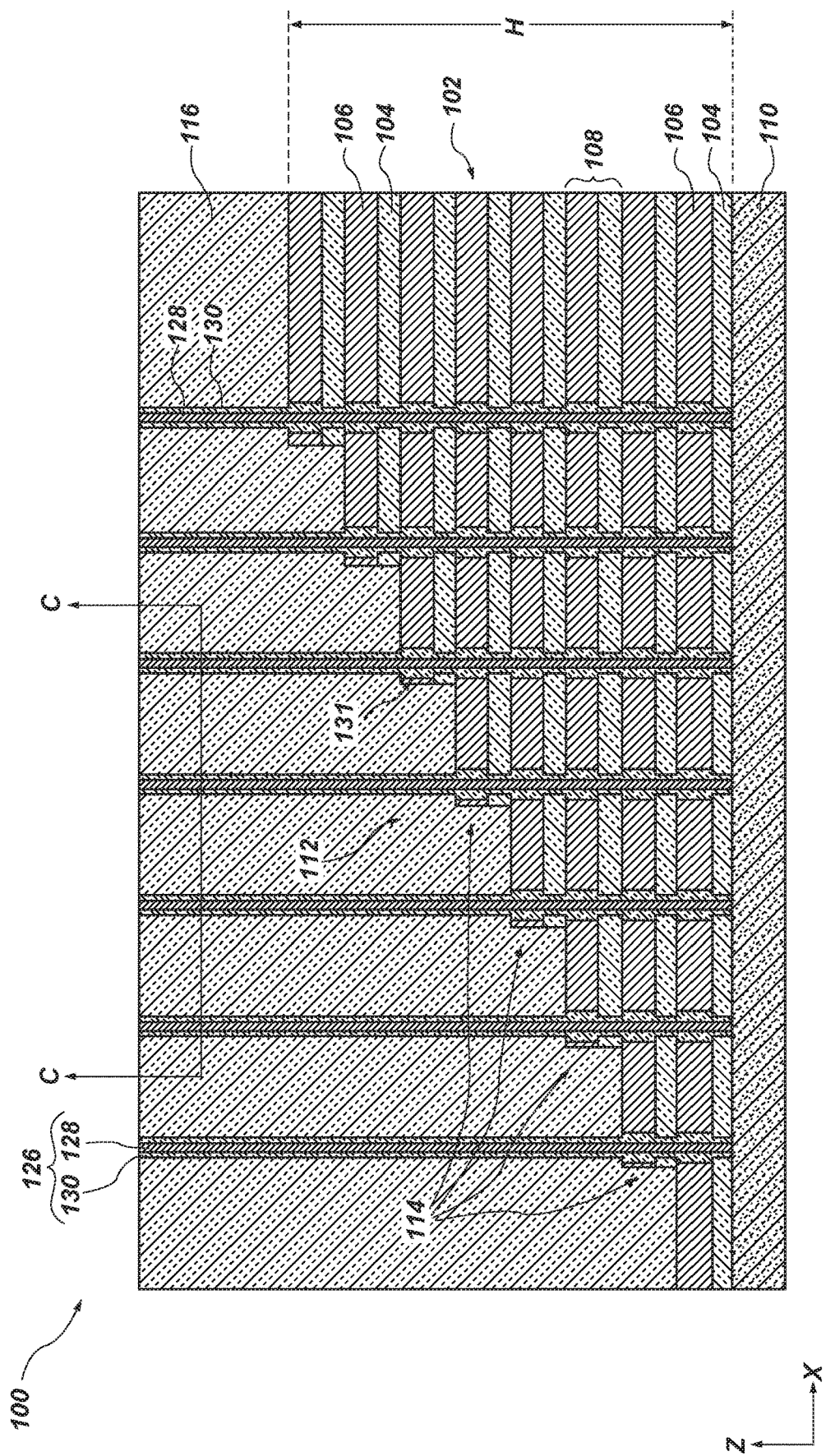
Figure 1C:
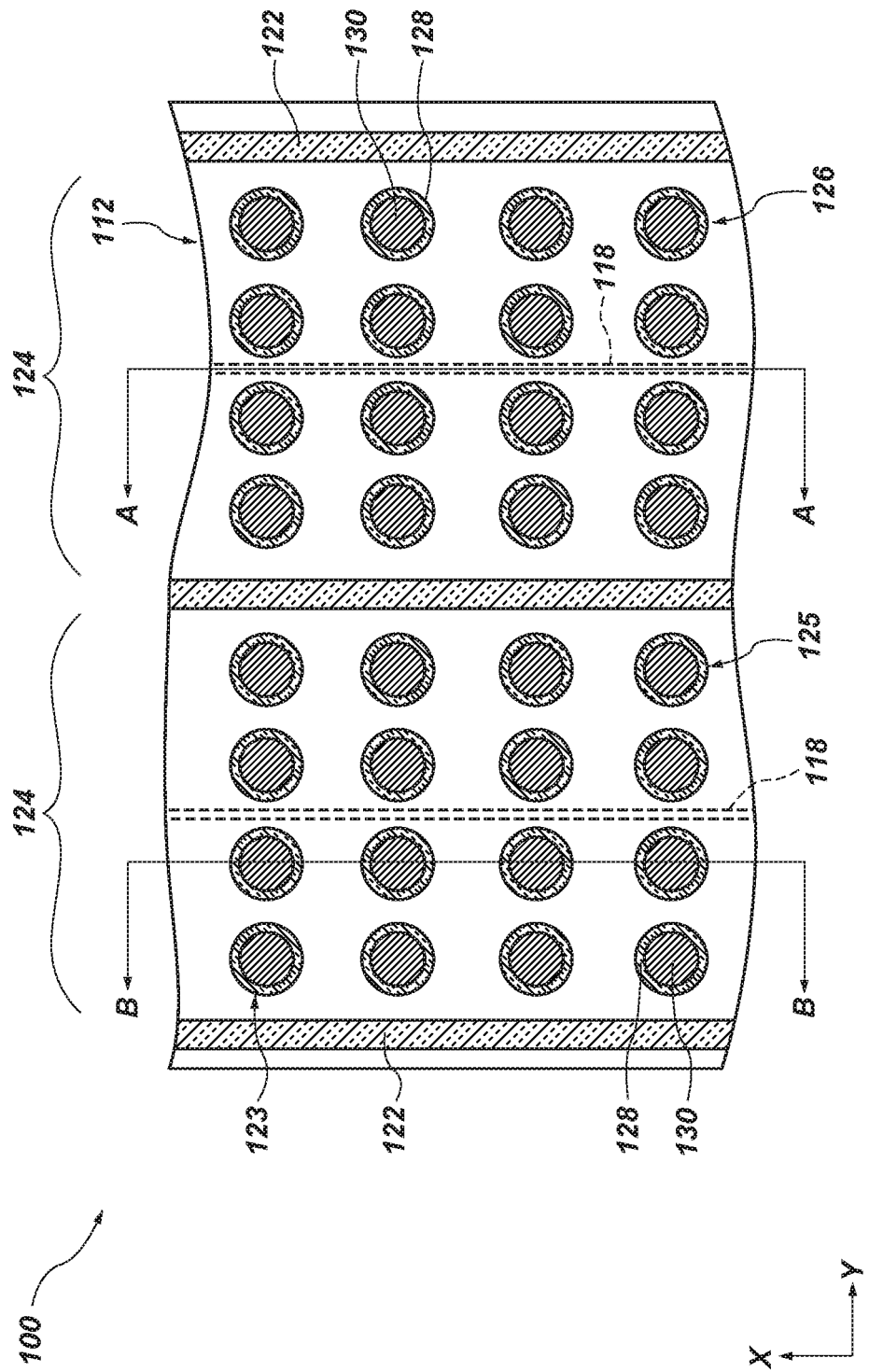

FIG. 1A and FIG. 1B are simplified partial cross-sectional views of a microelectronic device structure 100 and FIG. 1C is a simplified top-down view of the microelectronic device structure 100, in accordance with embodiments of the disclosure. FIG. 1A is a cross-section of the microelectronic device structure 100 taken through section line A-A of FIG. 1C, and FIG. 1B is a cross-section of the microelectronic device structure 100 taken through section line B-B of FIG. 1C. The microelectronic device structure 100 may, for example, comprise a portion of a memory device (e.g., a multi-deck 3D NAND Flash memory device, such as a dual deck 3D NAND Flash memory device).

With reference to FIG. 1A and FIG. 1B, the microelectronic device structure 100 includes a stack structure 102 including a vertically alternating (e.g., in the Z-direction) sequence of insulative structures 104 and conductive structures 106 (e.g., access line plates, word line plates) arranged in tiers 108. Each of the tiers 108 of the stack structure 102 may include at least one (1) of the insulative structures 104 vertically-neighboring at least one of the conductive structures 106.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The conductive structures 106 of the tiers 108 of the stack structure 102 may be formed of and include at least one conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 106 are formed of and include tungsten.

Each of the conductive structures 106 may individually include a substantially homogeneous distribution of the at least one conductive material, or a substantially heterogeneous distribution of the at least one conductive material. In some embodiments, each of the conductive structures 106 of each of the tiers 108 of the stack structure 102 exhibits a substantially homogeneous distribution of conductive material. In additional embodiments, at least one of the conductive structures 106 of at least one of the tiers 108 of the stack structure 102 exhibits a substantially heterogeneous distribution of at least one conductive material. The conductive structure 106 may, for example, be formed of and include a stack of at least two different conductive materials. The conductive structures 106 of each of the tiers 108 of the stack structure 102 may each be substantially planar, and may each exhibit a desired thickness.

In some embodiments, the conductive structures 106 may include a conductive liner material around the conductive structures 106, such as between the conductive structures 106 and the insulative structures 104. The conductive liner material may comprise, for example, a seed material from which the conductive structures 106 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 106 of the stack structure 102 may be employed as at least one lower select gate (e.g., at least one source side select gate (SGS)) of the microelectronic device structure 100. In some embodiments, a single (e.g., only one) conductive structure 106 of a vertically lowermost tier 108 of the stack structure 102 is employed as a lower select gate (e.g., a SGS) of the microelectronic device structure 100. In addition, upper conductive structure(s) 106 of the stack structure 102 may be employed as upper select gate(s) (e.g., drain side select gate(s) (SGDs)) of the microelectronic device structure 100. In some embodiments, horizontally neighboring conductive structures 106 of a vertically uppermost tier 108 of the stack structure 102 are employed as upper select gates (e.g., SGDs) of the microelectronic device structure 100.

Although FIG. 1A and FIG. 1B illustrate a particular number of tiers 108 of the insulative structures 104 and the conductive structures 106, the disclosure is not so limited. In some embodiments, the stack structure 102 includes a desired quantity of the tiers 108, such as sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108) of the insulative structures 104 and the conductive structures 106. In addition, in some embodiments, the stack structure 102 overlies a deck structure comprising additional tiers 108 of insulative structures 104 and conductive structures 106, separated from the stack structure 102 by at least one dielectric material, such as an interdeck insulative material.

With continued reference to FIG. 1A and FIG. 1B, the microelectronic device structure 100 further includes a source structure 110 (also referred to as a "source tier") vertically underlying (e.g., in the Z-direction) the stack structure 102. The source structure 110 may comprise, for example, a source plate. The source structure 110 may be formed of and include at least one conductive material, such as a semiconductor material doped with one or more (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth). In some embodiments, the source structure 110 comprises conductively-doped silicon.

The microelectronic device structure 100 may further include at least one staircase structure 112 including steps 114 (e.g., contact regions) defined by horizontal edges of the tiers 108. The quantity of steps 114 included in the staircase structure 112 may be substantially the same as (e.g., equal to) or may be different than (e.g., less than, greater than) the quantity of tiers 108 in each the stack structure 102. As shown in FIG. 1A and FIG. 1B, in some embodiments, the steps 114 of the staircase structure 112 are arranged in order, such that steps 114 directly horizontally neighboring one another in the X-direction correspond to tiers 108 of the stack structure 102 directly vertically adjacent (e.g., in the Z-direction) one another. In additional embodiments, the steps 114 of the staircase structure 112 are arranged out of order, such that at least some steps 114 of the staircase structure 112 directly horizontally neighboring one another in the X-direction correspond to tiers 108 of stack structure 102 not directly vertically neighboring (e.g., in the Z-direction) one another.

A height H (e.g., in the Z-direction) of the staircase structure 112 between an uppermost step 114 and a lowermost step 114 may be within a range from about 5.0 μm to about 20.0 such as from about 5 microns (μm) to about 10.0 from about 10.0 μm to about 15.0 or from about 15.0 μm to about 20.0 In some embodiments, the height H is about 13.5 However, the disclosure is not so limited and the height H may be different than those described.

A first insulative material 116 may overlie the staircase structure 112 and provide electrical insulation between components thereof. The first insulative material 116 may be formed of and include one or more of the materials described above with reference to the insulative structures 104. In some embodiments, the first insulative material 116 comprises the same material composition as the insulative structures 104. In some embodiments, the first insulative material 116 comprises silicon dioxide.

With reference to FIG. 1A, in some embodiments, due to the aspect ratio of the first insulative material 116 (the ratio of the vertical height in the Z-direction to the width in one or both of the X-direction and the Y-direction), the first insulative material 116 may include one or more so-called seams 118, which may also be referred to as "gaps" or "voids". In some embodiments, the seam 118 may be the result of insufficient gap filling properties of the deposition method by which the first insulative material 116 is formed over the staircase structure 112. The seam 118 may extend in the horizontal direction (e.g., the X-direction) that is the same direction in which the steps 114 extend. Stated another way, the seam 118 may extend in a direction in which the vertical height (e.g., in the Z-direction) of the steps 114 change. In some embodiments, the seam 118 may also extend in the vertical direction (Z-direction). In some embodiments, the seam 118 is located vertically above (e.g., in the Z-direction) an uppermost one of the tiers 108.

The seam 118 may exhibit a horizontal dimension (e.g., in the Y-direction) that is within a range from about 40 nanometers (nm) to about 80 nm, such as from about 40 nm to about 60 nm, or from about 60 nm to about 80. However, the disclosure is not so limited and the horizontal dimension of the seam 118 may be different than those described above.

In some embodiments, the seam 118 may be located vertically above (e.g., in the Z-direction) the uppermost tier 108 of the insulative structures 104 and the conductive structures 106. In other embodiments, the seam 118 may be located vertically below (e.g., in the Z-direction) the uppermost tier 108 of the insulative structures 104 and the conductive structures 106. By way of nonlimiting example, the seam 118 may extend vertically below the uppermost two (2) tiers 108, the uppermost four (4) tiers 108, or even the uppermost six (6) tiers 108. The vertical location of the seam 118 may depend at least partially on the height H of the stack structure 102 and the height of the staircase structure 112.

Referring to FIG. 1C, the stack structure 102 (FIG. 1A, FIG. 1B) may be partitioned in the Y-direction orthogonal to the X-direction by slot structures 122. The slot structures 122 may vertically extend (e.g., in the Z-direction shown in FIG. 1A) into the stack structure 102. The slot structures 122 may, for example, vertically extend completely through the stack structure 102 and to, for example, the source structure 110. The slot structures 122 may divide (e.g., in the Y-direction) the stack structure 102 into multiple blocks structures 124. The slot structures 122 may, for example, be employed to form the conductive structures 106 (FIG. 1A, FIG. 1B) of the stack structure 102 through so-called "replacement gate" or "gate last" processing acts. For example, a preliminary stack structure may be formed to include tiers of alternating insulative structures 104 and sacrificial structures (e.g., additional insulative structures selectively etchable relative to the insulative structures 104, such as dielectric nitride structures if the insulative structures 104 comprise dielectric oxide structures). The staircase structure 112 may be formed within the preliminary stack structure. Slots (also referred to herein as "replacement gate slots") may be formed through the preliminary stack structure at locations corresponding to the locations of the slot structures 122 to extend through the first insulative material 116 and the preliminary stack structure of the microelectronic device structure 100. The sacrificial structures may be selectively removed (e.g., exhumed) through the slots and spaces between vertically neighboring (e.g., in the Z-direction) insulative structures 104 may be filled with a conductive material to form the stack structure 102 including the tiers 108 of the insulative structures and the conductive structures 106. The conductive structures 106 may be located at locations corresponding to the locations of the sacrificial structures removed through the slots. After forming the conductive structures 106, the slots may be filled with a dielectric material to form the slot structures 122.

In some embodiments, at least some (e.g., all) of the block structures 124 may be subdivided with second slots located at, for example, end portions (in the Y-direction) of the staircase structure 112 to subdivide (in the Y-direction) the blocks structures 124 into multiple sub-blocks. The second slots may, for example, be employed to further divide at least the uppermost conductive structures 106 (FIG. 1A, FIG. 1B) of the stack structure 102 so that the uppermost conductive structures 106 may be employed as upper select gates (e.g., SGDs) of the block structures 124 of the stack structure 102.

With collective reference to FIG. 1B and FIG. 1C, the microelectronic device structure 100 may further include support pillar structures 126 comprising a first material 128 vertically extending through the stack structure 102 and to the source structure 110 and a liner material 130 on sidewalls of the first material 128. The liner material 130 may substantially surround (e.g., substantially horizontally and vertically cover) sidewalls of the first material 128.

With reference to FIG. 1C, the support pillar structures 126 may be arranged in rows 123 and columns 125. The columns 125 may extend in the first horizontal direction in the same direction as the slot structures 122. In some embodiments, the rows 123 extend in the second horizontal direction substantially perpendicular to the first horizontal direction.

The first material 128 may be formed of and include at least one conductive material, such as such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the first material 128 of each of the support pillar structures 126 has substantially the same material composition.

In other embodiments, the first material 128 is formed of and includes an insulative material. In some such embodiments, the first material 128 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 128 comprises $SiO_2$. In some embodiments, such as where the first material 128 comprises an insulative material, the microelectronic device structure 100 may not include the liner material 130 on sidewalls of the first material 128 and the support pillar structures 126 may comprise only the first material 128 (e.g., the insulative material).

The support pillar structures 126 may each individually exhibit a desired geometric configuration (e.g., dimensions and shape) and spacing. The geometric configurations and spacing of the support pillar structures 126 may be selected at least partially based on the configurations and positions of other components (e.g., the steps 114 of the staircase structure 112, conductive contact structures to be formed in contact with the steps 114 of the staircase structure 112, the source structure 110) of the microelectronic device structure 100. For example, the support pillar structures 126 may each individually have a geometric configuration and spacing permitting the support pillar structure 126 to vertically-extend (e.g., in the Z-direction) through the stack structure 102 and physically contact (e.g., land on) a structure of the source structure 110 to facilitate a predetermined function (e.g., an electrical interconnection function, a support function) of the support pillar structure 126. In other embodiments, the support pillar structures 126 do not include an electrical interconnection function and serve primarily (e.g., only) a support function. Each of the support pillar structures 126 may exhibit substantially the same geometric configuration (e.g., the same dimensions and the same shape) and horizontal spacing (e.g., in the X-direction) as each of the other support pillar structures 126, or at least some of the support pillar structures 126 may exhibit a different geometric configuration (e.g., one or more different dimensions, a different shape) and/or different horizontal spacing than at least some other of the support pillar structures 126. In some embodiments, the support pillar structures 126 are at least partially uniformly spaced in the X-direction and in the Y-direction. In some embodiments, the support pillar structures 126 are arranged in columns extending in the X-direction and in rows extending in the Y-direction between the slot structures 122. In other embodiments, the support pillar structures 126 are at least partially non-uniformly spaced in the X-direction.

The support pillar structures 126 may serve as support structures during and/or after the formation of one or more components of the microelectronic device structure 100. For example, the support pillar structures 126 may serve as support structures for the formation of the conductive structures 106 during replacement of sacrificial structures with conductive structures 106, as described above with reference to the "replacement gate" or "gate last" processing acts. The support pillar structures 126 may impede (e.g., prevent) tier collapse during the selective removal of the sacrificial structures. In addition, one or more of the support pillar structures 126 may serve as conductive structures (e.g., through array vias) providing electrical communication between one or more components of the microelectronic device structure 100. By way of non-limiting example, one or more of the support pillar structures 126 may provide electrical communication between the source structure 110 and at least another component of the microelectronic device structure 100.

The liner material 130 may be horizontally interposed between each of the first materials 128 of the support pillar structures 126 and the tiers 108 (including the insulative structures 104 and the conductive structures 106 thereof) of the stack structure 102. With reference to FIG. 1B, in some embodiments, the liner material 130 exhibits a greater dimension in the X-direction and the Y-direction at portions 131 neighboring the conductive structures 106 than along other portions of the support pillar structures 126. For example, the liner material 130 may exhibit a relatively larger dimension at the portions 131 corresponding to intersections of the conductive structures 106 and the liner material 130 of the support pillar structures 126 at relative to other portions of the liner material 130.

The liner material 130 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 130 comprises Sift. In some embodiments, the liner material 130 has a different material composition as the first insulative material 116. In other embodiments, the liner material 130 has the same material composition as the first insulative material 116. In some embodiments, the liner material 130 comprises a material composition that is not substantially removed responsive to exposure to etch chemistries formulated and configured to remove silicon nitride.

Figure 1D:
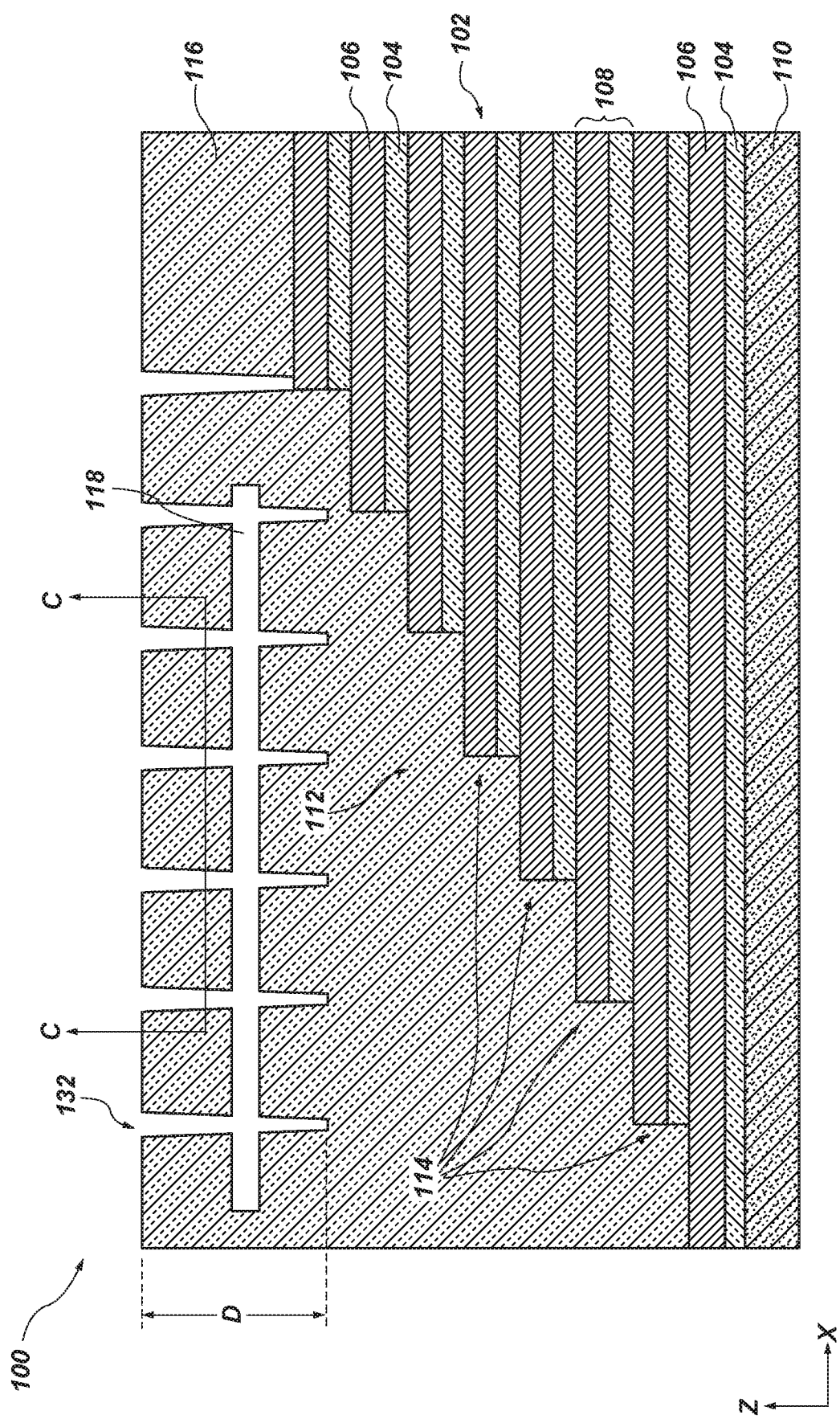
Figure 1E:
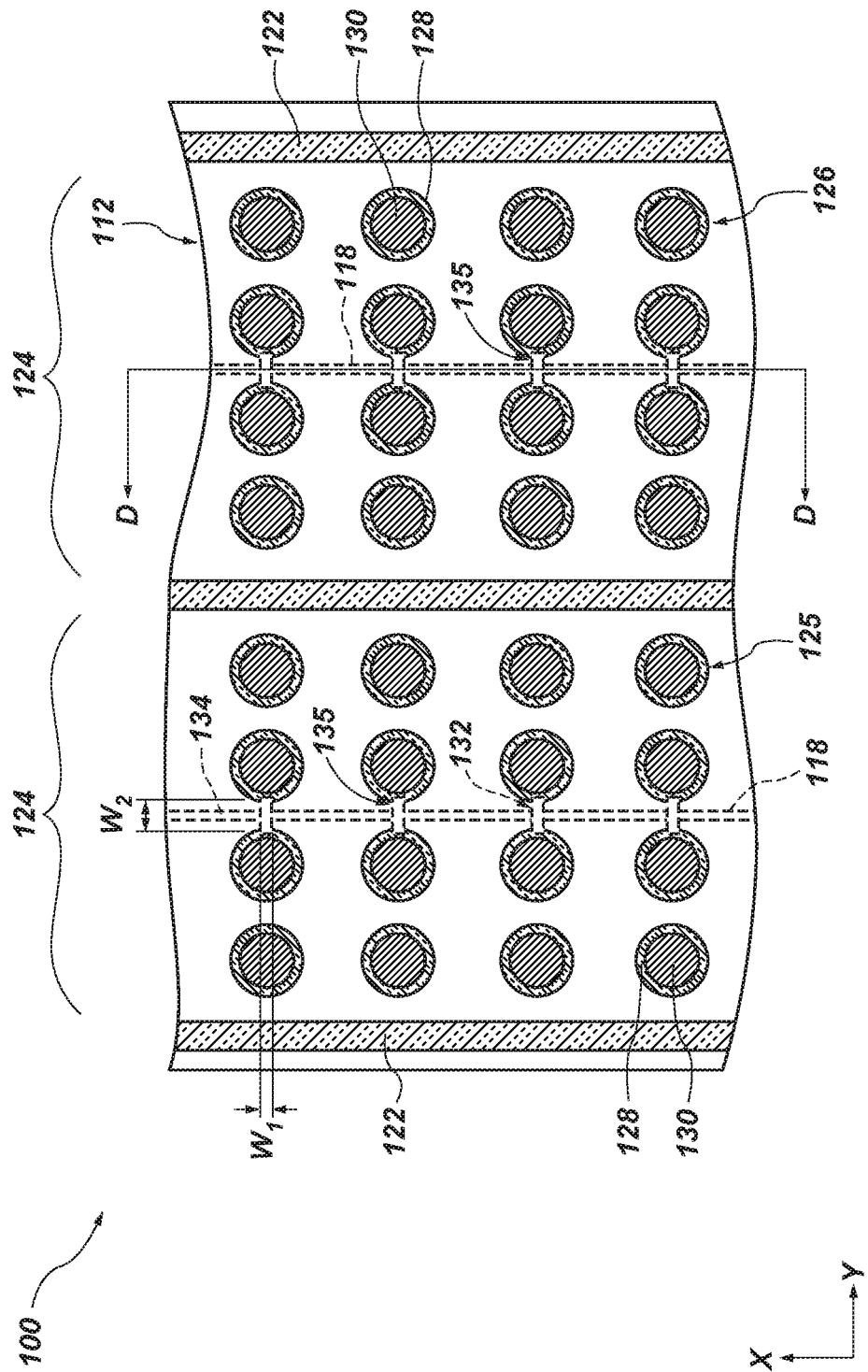

Referring now to FIG. 1D and FIG. 1E, trenches 132 (which may also be referred to herein as "openings") may be formed through portions of the first insulative material 116. FIG. 1D is a simplified cross-sectional view of the microelectronic device structure 100 taken through section line D-D of FIG. 1E, which is a simplified top-down view of the microelectronic device structure 100. With collective reference to FIG. 1D and FIG. 1E, the trenches 132 may be arranged and spaced in a horizontal direction (e.g., in the X-direction) between the slot structures 122. In other words, horizontally neighboring trenches 132 may be spaced from each other in the X-direction. At least some of the trenches 132 may intersect the seam 118 such that the open volume within the trenches 132 is in communication with the open volume of the seam 118.

The trenches 132 may each individually extend in the vertical (e.g., the Z-direction) and in a horizontal direction (e.g., the Y-direction) between horizontally neighboring support pillar structures 126. The trenches 132 may be referred to herein as "horizontal bars". The trenches 132 are illustrated in broken lines in FIG. 1E to indicate that they are located below an uppermost surface of the first insulative material 116.

A width $W_1$ of the trenches 132 in a first horizontal direction (e.g., the X-direction) may be within a range from about 50 nm to about 70 nm, such as from about 50 nm to about 60 nm, or from about 60 nm to about 70 nm. In some embodiments, the width $W_1$ is about 60 nm. However, the disclosure is not so limited and the width $W_1$ may be different than those described.

A width $W_2$ of the trenches 132 in a second horizontal direction (e.g., the Y-direction) may be within a range from about 200 nm to about 300 nm, such as from about 200 nm to about 250 nm, or from about 250 nm to about 300 nm. In some embodiments, the width $W_2$ is about 250 nm. However, the disclosure is not so limited and the width $W_2$ may be different than those described.

Although the trenches 132 have been described and illustrated as exhibiting a rectangular shape, the disclosure is not so limited. In other embodiments, the trenches 132 exhibit an oval shape, a square shape, or another shape.

Referring to FIG. 1D, the trenches 132 may extend below (e.g., in the Z-direction) an uppermost tier 108 of the insulative structures 104 and the conductive structures 106. In some embodiments, the trenches 132 may extend lower than the uppermost tier 108, the uppermost three tiers 108, the uppermost five tiers 108, or more than the uppermost six tiers 108. In other embodiments, the trenches 132 vertically extend (e.g., in the Z-direction) to a location vertically above the uppermost tier 108.

A vertical (e.g., in the Z-direction) depth D of the trenches 132 may be within a range from about 150 nm to about 190 nm, such as from about 150 nm to about 170 nm, or from about 170 nm to about 190 nm. In some embodiments, the depth D is about 170 nm. However, the disclosure is not so limited and the depth D may be different than those described.

With reference to FIG. 1E, formation of the trenches 132 may remove portions of the support pillar structures 126 horizontally neighboring the seam 118 (e.g., nearest the seam 118) and form recessed portions 135 of the support pillar structures 126. The support pillar structures 126 horizontally neighboring the seam 118 and located within horizontally central portions of block structure 124 may include the recessed portions 135 while the support pillar structures 126 that do not horizontally neighbor the seam 118 do not include the recessed portions 135.

Figure 1F:
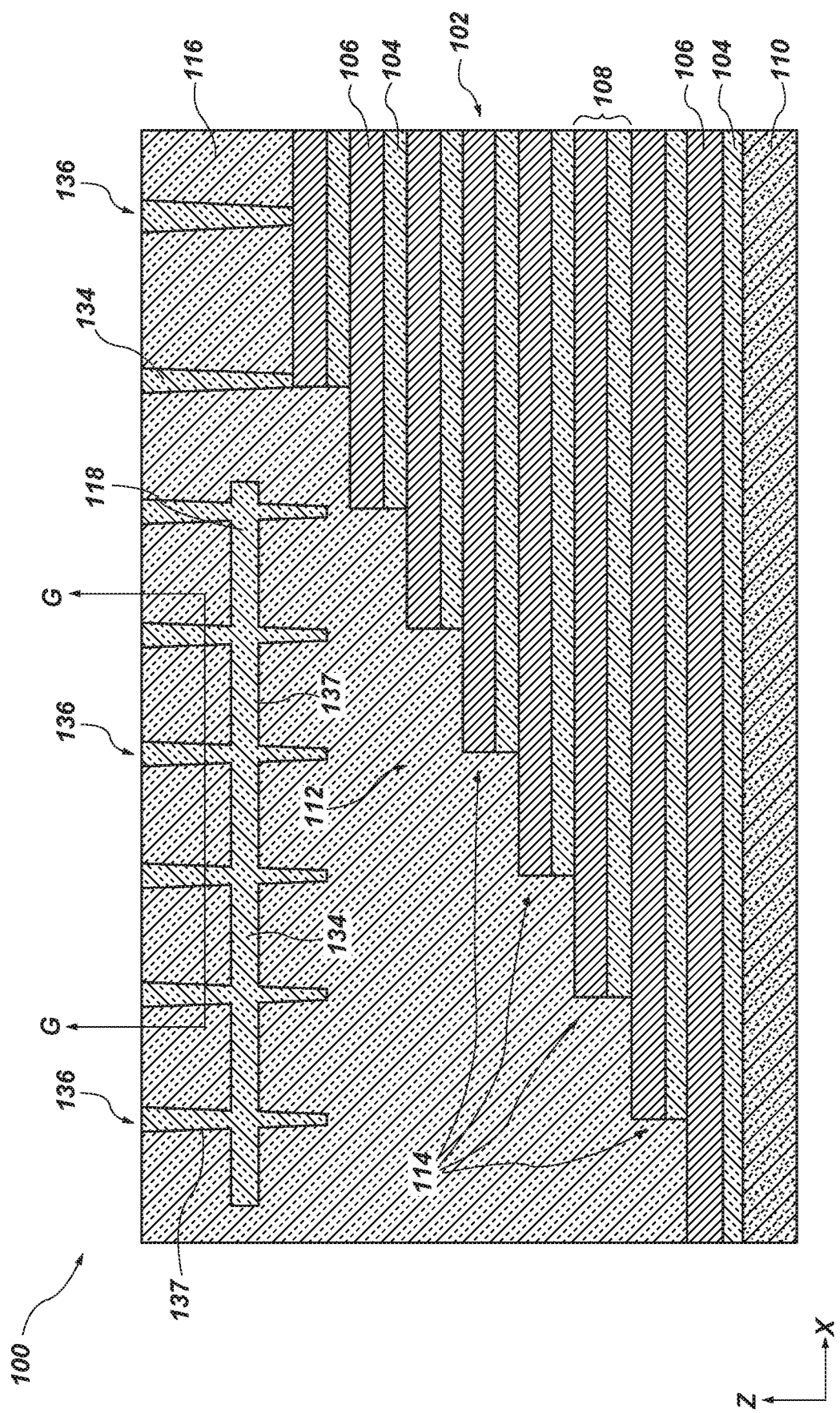
Figure 1G:
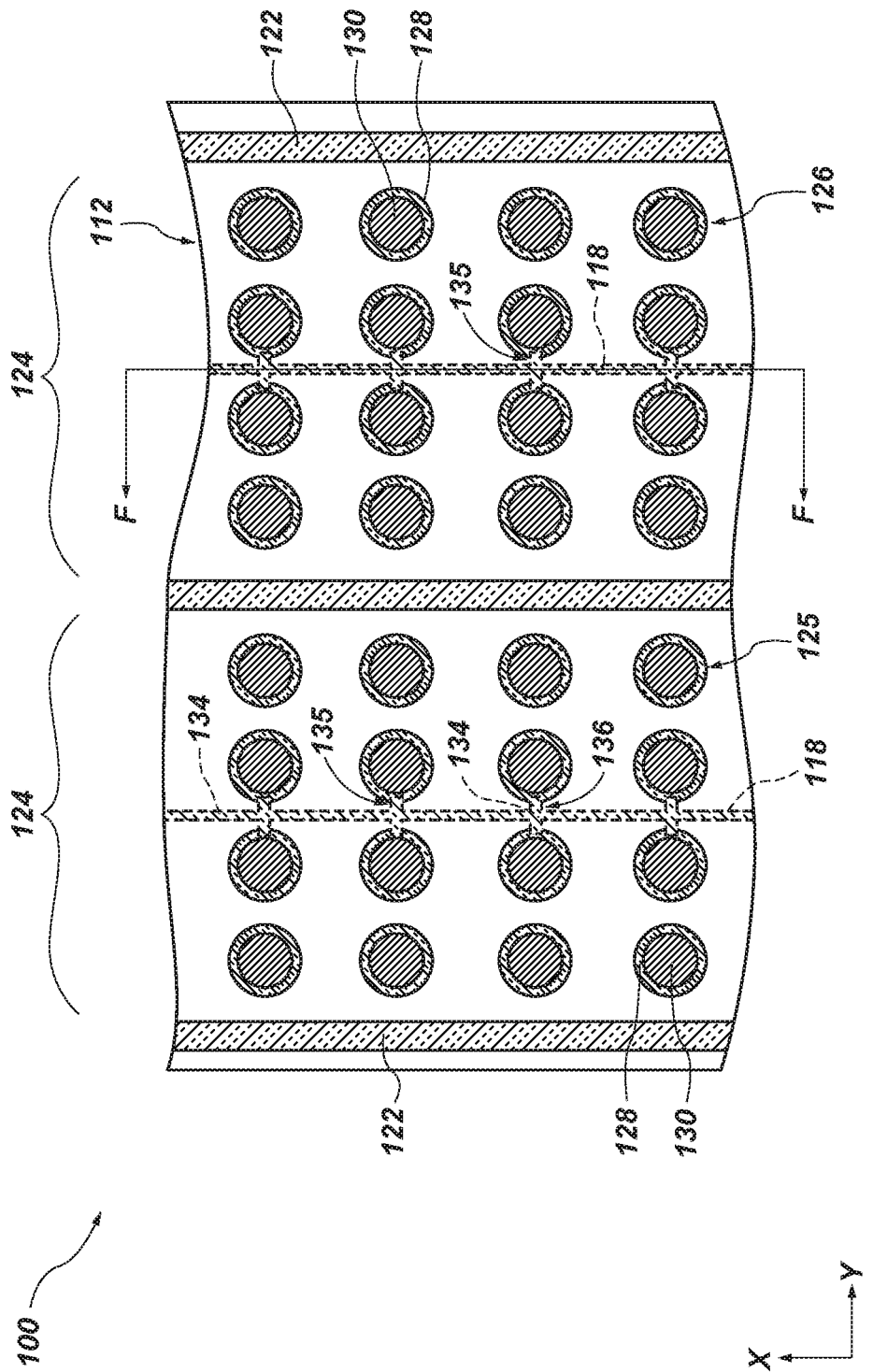

Referring collectively to FIG. 1F and FIG. 1G, the trenches structures 132 and the seam 118 may be filled with a second insulative material 134 to form isolation structures 136. FIG. 1F is a simplified cross-sectional view of the microelectronic device structure 100 of FIG. 1G taken through section line F-F of FIG. 1G, which is a top-down view of the microelectronic device structure 100. In some embodiments, substantially all void space within the trenches 132 (FIG. 1D, FIG. 1E) and the seam 118 is filled with the second insulative material 134 to form the isolation structures 136. In some such embodiments, the seam 118 is substantially filled with the second insulative material 134.

In some embodiments, the isolation structures 136 may exhibit a tapered profile. In some such embodiments, vertical (e.g., in the Z-direction) sidewalls of the isolation structures 136 may be angled with respect to a horizontal plane (e.g., a major surface of the source structure 110).

The second insulative material 134 may be formed of and include a dielectric material. In some embodiments, the second insulative material 134 comprises one or more of the materials described above with reference to the insulative structures 104. In some embodiments, the second insulative material 134 comprises substantially the same material composition as the insulative structures 104. In some embodiments, the second insulative material 134 comprise silicon dioxide. In some embodiments, the second insulative material 134 comprises a different material composition than the first insulative material 116. In some embodiments, the second insulative material 134 exhibits one or more different physical properties (e.g., density, dielectric constant) than the first insulative material 116.

In some embodiments, an interface 137 may be present between the first insulative material 116 and the second insulative material 134, even in embodiments where the first insulative material 116 and the second insulative material 134 comprise substantially the same material composition. In some embodiments, the second insulative material 134 formed in the trench structures 132 and the seam 118 may exhibit an orientation that is substantially perpendicular to the orientation of the first insulative material 116. In some embodiments, the interface 137 may exhibit a change in the orientation of the first insulative material 116 and the second insulative material 134.

The second insulative material 134 may be formed by one or more of ALD, CVD, plasma enhanced ALD, PVD, PECVD, or LPCVD. In some embodiments, the second insulative material 134 is formed by ALD. In some embodiments, the second insulative material 134 comprises silicon dioxide formed by ALD.

Figure 1H:
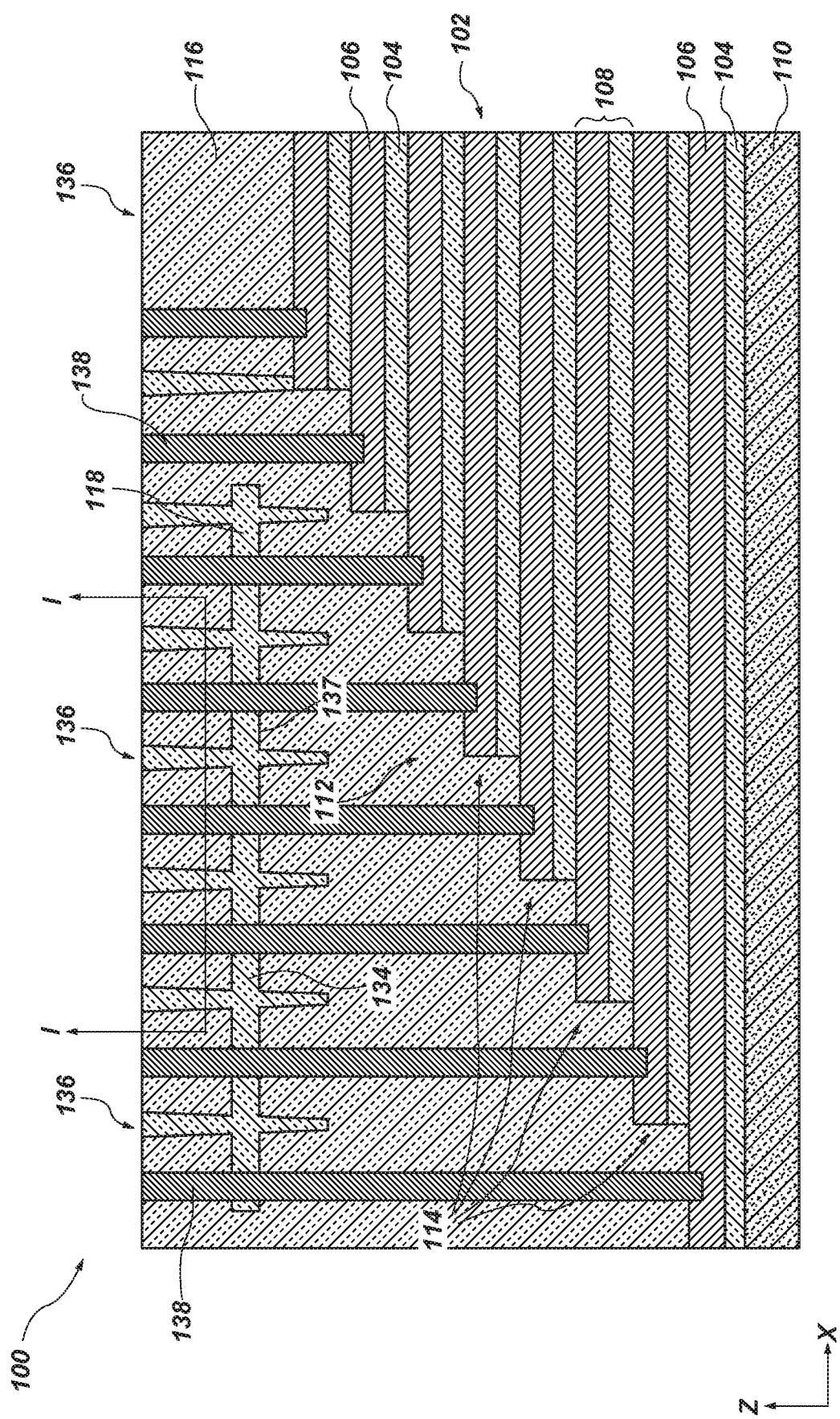
Figure 1I:
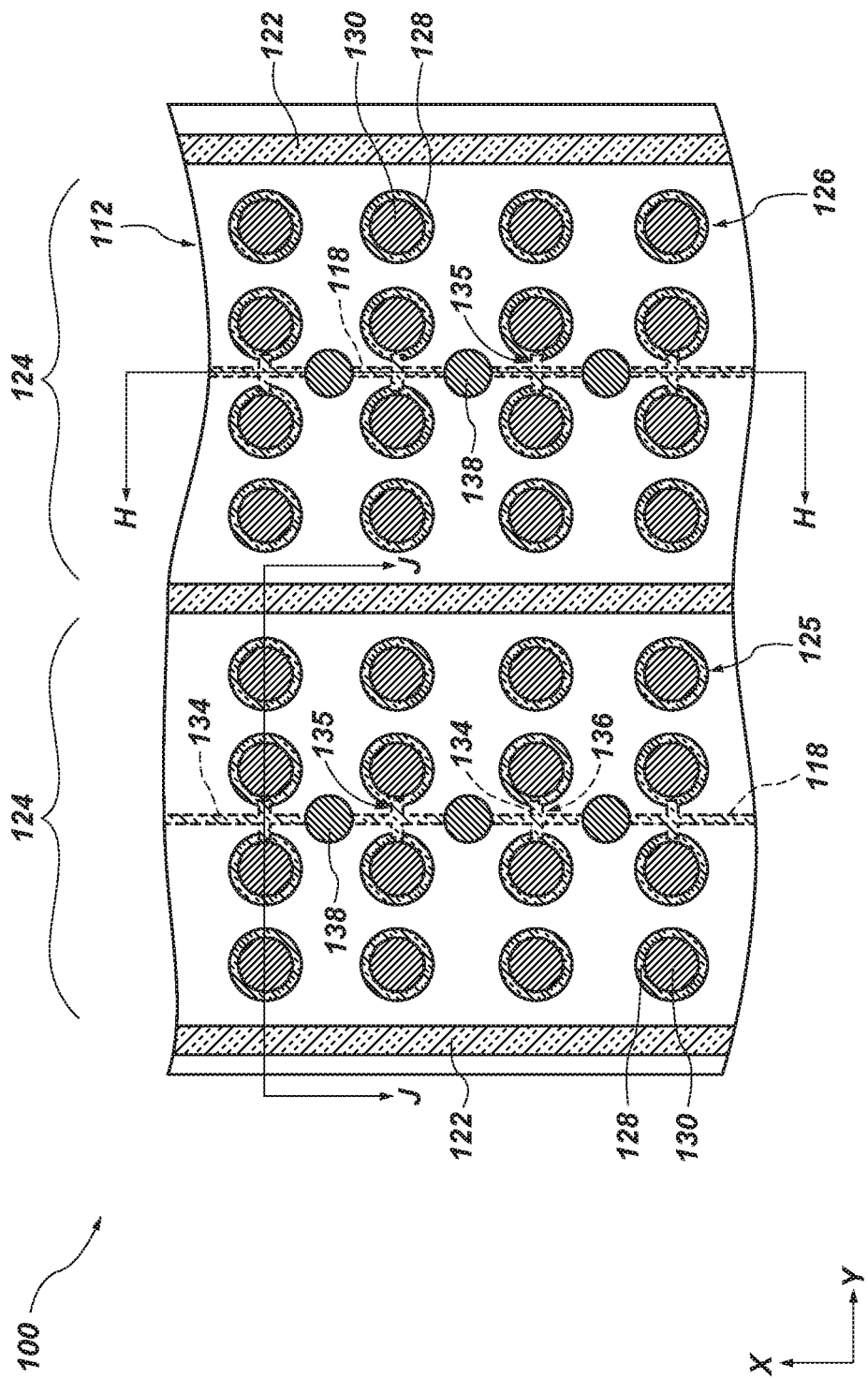

With reference to FIG. 1H and FIG. 1I, after forming the isolation structures 136, openings may be formed through the first insulative material 116 and the second insulative material 134 of the seam 118 to expose portions of the conductive structures 106 of the steps 114 of the staircase structure 112. FIG. 1H is a simplified partial cross-sectional view of the microelectronic device structure 100 of FIG. 1I taken through section line H-H. FIG. 1I is a simplified partial top-down view of the microelectronic device structure 100.

After forming the openings, the openings may be filled with conductive material to form conductive contact structures 138. The conductive contact structures 138 may be symmetrically located with the block structures 124 such that they are located between (in the Y-direction) the slot structures 122. In some embodiments, the conductive contact structures 138 are located centrally (in the Y-direction) between adjacent slot structures 122. Stated another way, the conductive contact structures 138 may be located about equally between the slot structures 122 defining the particular block structure 124 within which the conductive contact structures 138 are located. In some such embodiments, the block structures 124 may be symmetrical.

The conductive contact structures 138 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the conductive contact structures 138 may have substantially the same material composition, or at least one of the conductive contact structures 138 may have a different material composition than at least one other of the conductive contact structures 138. In some embodiments, the conductive contact structures 138 comprise titanium, titanium nitride, and tungsten. In some embodiments, the conductive contact structures 138 comprise a liner comprising titanium nitride defining external portions thereof and tungsten defining internal portions thereof.

At least some of the tiers 108 of the stack structure 102 may be coupled to at least one of the conductive contact structures 138 at one or more of the steps 114 of the staircase structure 112. Referring to FIG. 1H, in some embodiments, at least some of the conductive contact structures 138 on the steps 114 of the staircase structure 112 are horizontally aligned with one another. For example, as shown in FIG. 1H and FIG. 1I, at least some (e.g., all) conductive contact structures 138 horizontally neighboring one another in the (and, hence, on steps 114 at different vertical positions than one another) within the same block structure 124 may be substantially aligned with one another in the Y-direction. As another example, as also shown in FIG. 1H and FIG. 1I, at least some (e.g., all) conductive contact structures 138 horizontally neighboring one another in the Y-direction (and, hence, on steps 114 at substantially the same vertical position as one another) may be substantially aligned with one another in the X-direction. In some embodiments, each block structure 124 may include a single conductive contact structure 138 on each step 114 and an individual block structure 124 may not include conductive contact structures 138 horizontally aligned with one another in the Y-direction located in the same block structure 124. In some such embodiments, the conductive contact structures 138 horizontally neighboring each other in the Y-direction may be located in adjacent block structures 124.

In some embodiments, the second insulative material 134 of the seam 118 may reduce the likelihood of an electrical short between the conductive contact structures 138. In other words, since the trenches 132 are filled with the second insulative material 134 and the seam 118 is at least partially filled with the second insulative material 134, the second insulative material 134 may substantially prevent electrical shorting between the conductive contact structures 138. Stated another way, the second insulative material 134 of the trenches 132 and the seam 118 may intervene between potential paths through which the horizontally neighboring conductive contact structures 138 could short. The second insulative material 134 may substantially reduce (e.g., prevent) formation of conductive material within the seam 118 or the trenches 132 during formation of the conductive contact structures 138. In other words, since the seam 118 and the trench structures 132 (FIG. 1D, FIG. 1E) are filled with the second insulative material 134 prior to formation of the conductive contact structures 138, the second insulative material 134 and the isolation structures 136 may substantially reduce or prevent electrical shorting between horizontally neighboring conductive contact structures 138. By way of comparison, conventional microelectronic device structures that do not include the second insulative material 134 or the isolation structures 136 may include conductive contact structures that electrically short to each other through the seams, since the seams are filled with conductive material during formation of the conductive contact structures.

Figure 1J:
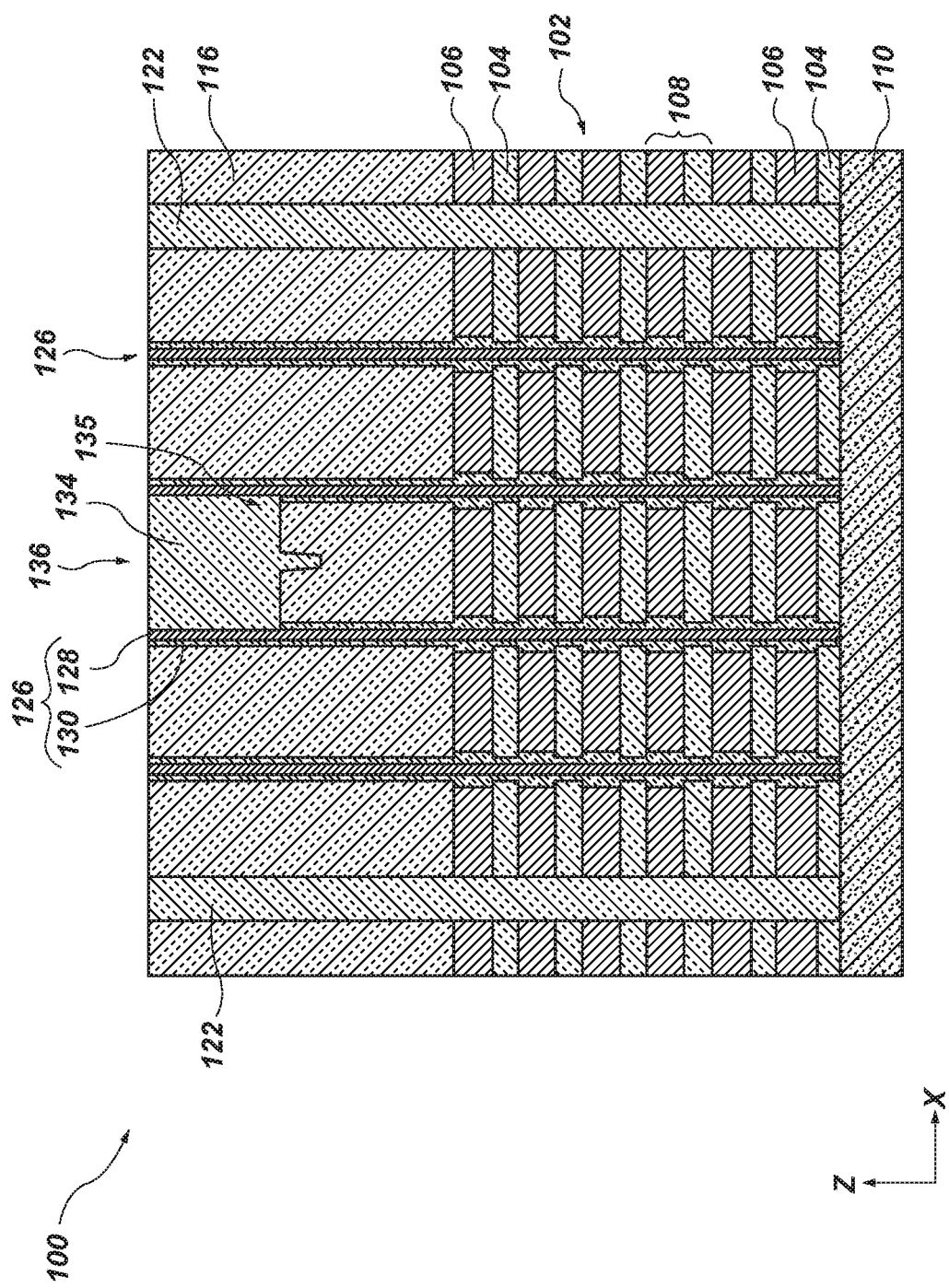

FIG. 1J is a simplified partial cross-sectional view of the microelectronic device structure 100 of FIG. 1I taken through section line J-J of FIG. 1I. With reference to FIG. 1J, the isolation structure 136 may extend between horizontally central (e.g., in the Y-direction) support pillar structures 126 horizontally between the slot structures 122 and the horizontally central support pillar structures 126 may include the recessed portions 135 filled with the second insulative material 134.

With continued reference to FIG. 1J, in some embodiments, formation of the trenches 132 (FIG. 1D, FIG. 1E) may remove portions of the support pillar structures 126 horizontally neighboring the trenches 132. Accordingly, in some embodiments, the support pillar structures 126 horizontally neighboring the isolation structures 136 may exhibit a smaller horizontal dimension (e.g., width) in a horizontal direction (e.g., the Y-direction) at vertically upper portions thereof (e.g., proximate the isolation structures 136) than at vertically lower portions of the support pillar structures 126. In some such embodiments, a distance between horizontally neighboring support pillar structures 126 in a horizontal direction (e.g., the Y-direction) may be greater proximate the isolation structures 136 than at lower portions of the support pillar structures 126. In some embodiments, the second insulative material 134 directly contacts the first material 128 of the neighboring support pillar structures 126. It will be understood that the vertical height (e.g., in the Z-direction) of the uppermost conductive structure 106 illustrated in FIG. 1J depends on the vertical height of the uppermost step 114 (FIG. 1H) in the cross-section illustrated in FIG. 1J.

Although FIG. 1A through FIG. 1J have been described and illustrated as including a particular structure to isolate the conductive contact structures 138, the disclosure is not so limited. FIG. 2A through FIG. 2D illustrate a method of forming a microelectronic device structure 200, in accordance with additional embodiments of the disclosure.

Figure 2A:
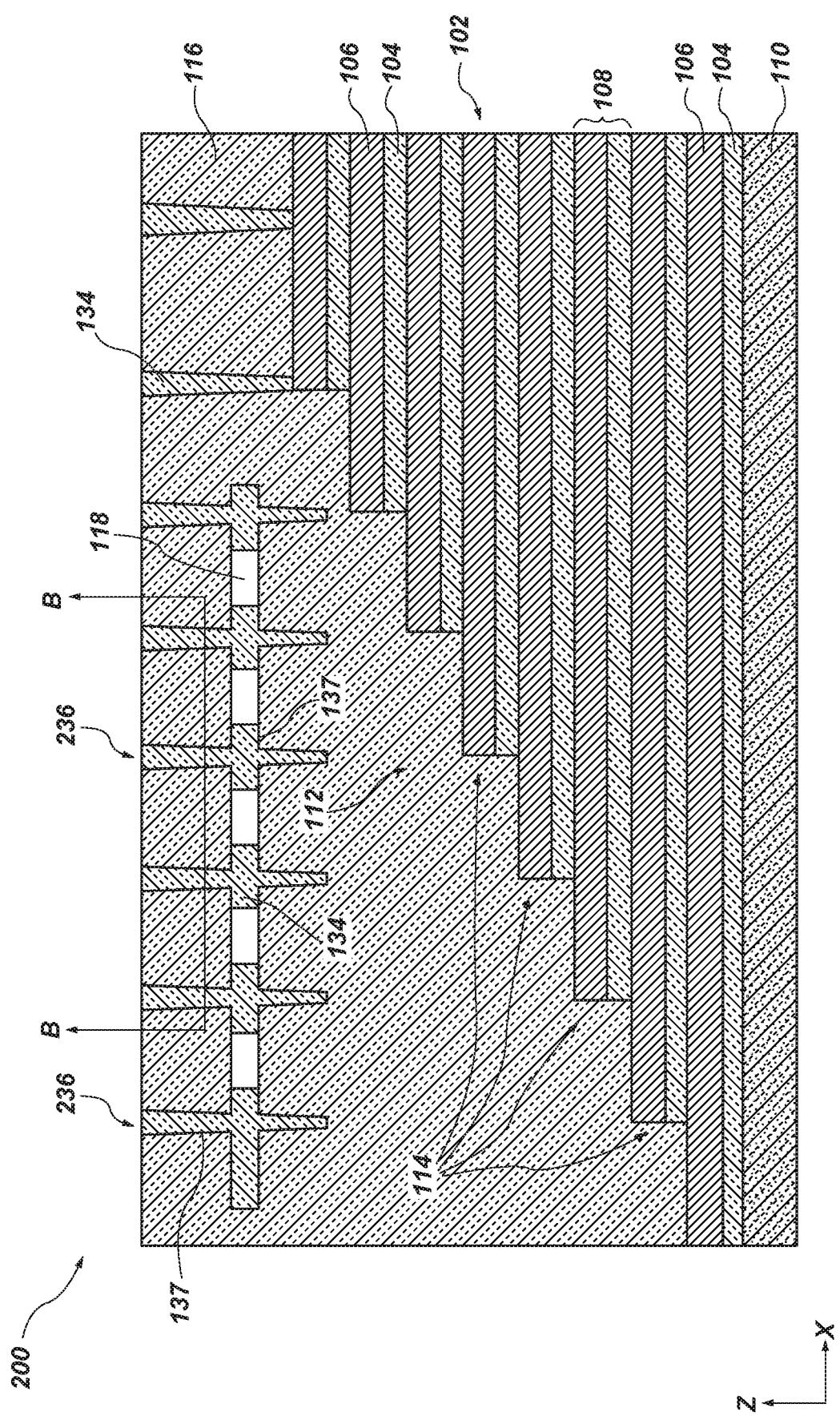
FIG. 2A through FIG. 2D are simplified cross-sectional views (FIG. 2A and FIG. 2C) and top-down views (FIG. 2B and FIG. 2D) illustrating a method of forming a microelectronic device, in accordance with other embodiments of the disclosure.
Figure 2B:
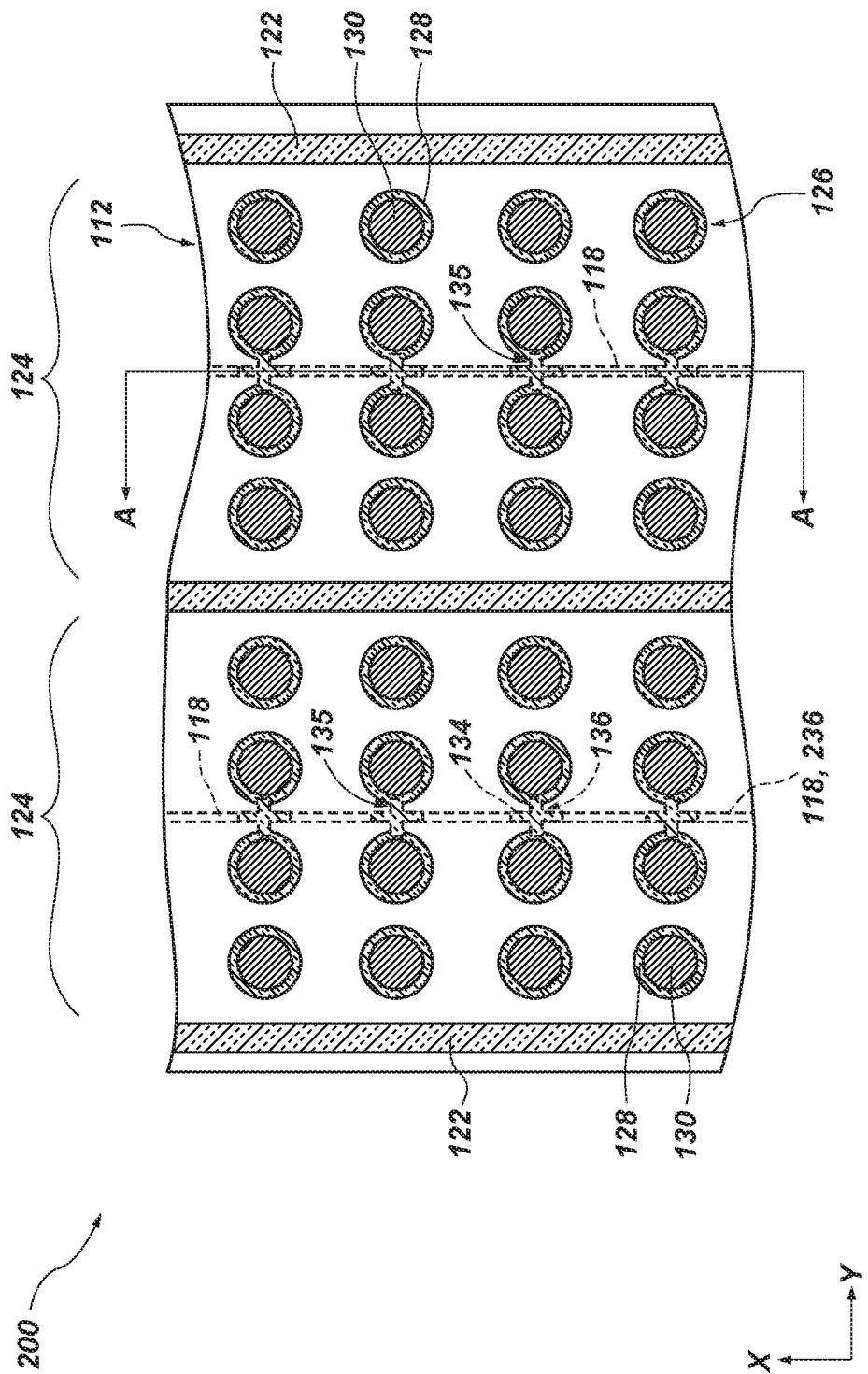

FIG. 2A is a simplified cross-sectional view of the microelectronic device structure 200 and FIG. 2B is a simplified top-down view of the microelectronic device structure 200. FIG. 2A is a cross-section of the microelectronic device structure 200 of FIG. 2B taken through section line A-A of FIG. 2B. The microelectronic device structure 200 may be substantially similar to the microelectronic device structure 100 at the processing stage previously described with reference to FIG. 1F and FIG. 1G, except that, rather than substantially filling the seam 118 and the trenches 132 (FIG. 1D, FIG. 1E) with the second insulative material 134, the seam 118 is only partially filled with the second insulative material 134 to form isolation structures 236. With collective reference to FIG. 2A and FIG. 2B, portions of the seam 118 between horizontally neighboring isolation structures 236 may be void and may not include the second insulative material 134.

The second insulative material 134 may be formed in substantially the same manner as described above with reference to FIG. 1F and FIG. 1G.

Figure 2C:
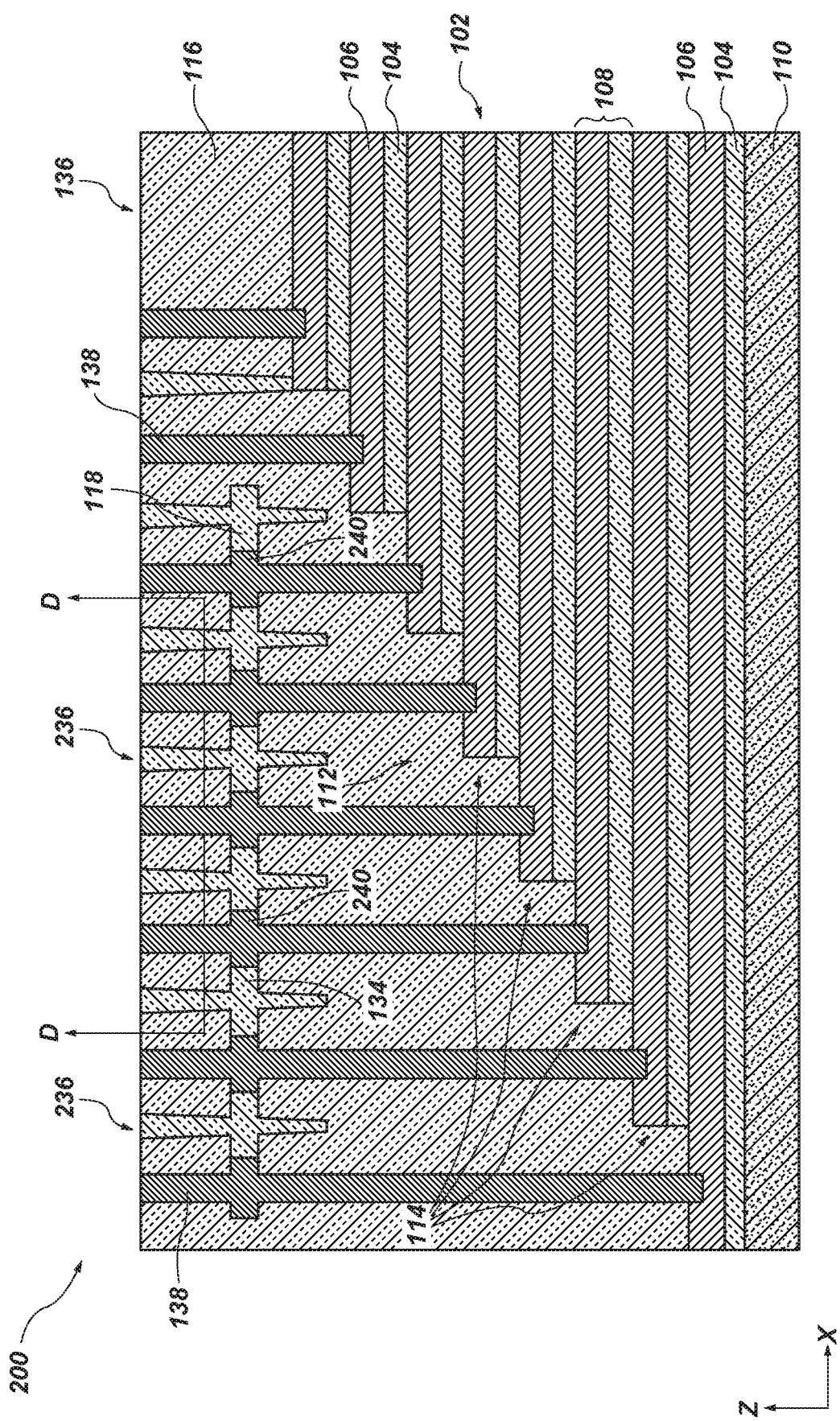
Figure 2D:
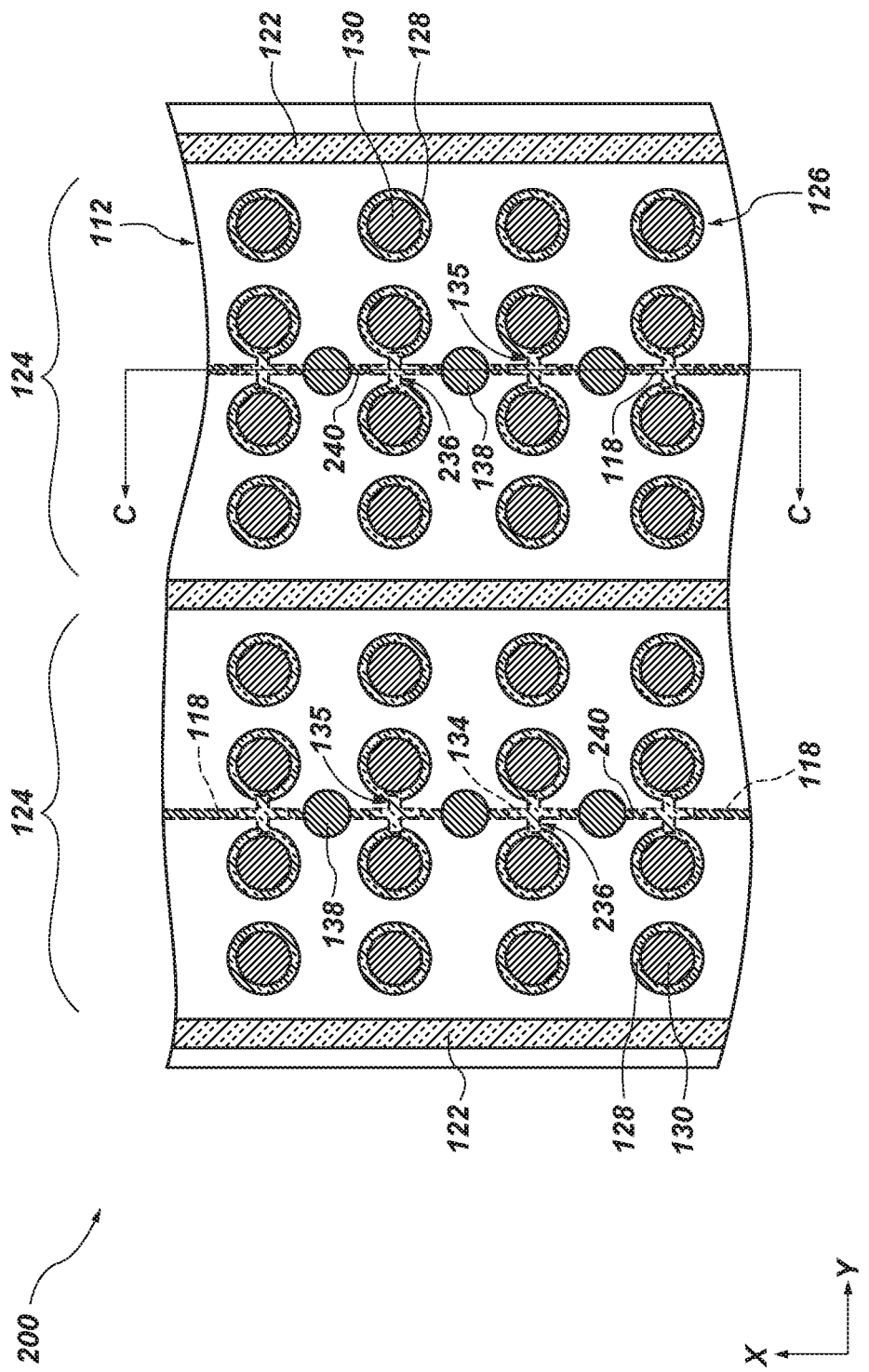

Referring now to FIG. 2C and FIG. 2D, after forming the isolation structures 236, openings may be formed through the first insulative material 116 and the second insulative material 134 of the seam 118 to expose portions of the conductive structures 106 of the steps 114. FIG. 2C is a simplified partial cross-sectional view of the microelectronic device structure 100 of FIG. 2D taken through section line D-D of FIG. 2D.

After forming the openings, the openings may be filled with conductive material to form conductive contact structures 138, as described above with reference to FIG. 1H and FIG. 1I. With continued reference to FIG. 2C and FIG. 2D, portions of the seam 118 may be filled with the second insulative material 134 and other portions of the seam 118 may be filled with conductive material of the conductive contact structures 138. For example, the conductive contact structures 138 may include horizontally extending portions 240 of the conductive material, horizontally extending between horizontally neighboring conductive contact structures 138 and separated from each other by the isolation structures 236 and the second insulative material 134.

The isolation structures 236 and the second insulative material 134 may reduce the likelihood of an electrical short between the conductive contact structures 138. In other words, since the trenches 132 are filled with the second insulative material 134 and the seam 118 is at least partially filled with the second insulative material 134, the second insulative material 134 may substantially prevent electrical shorting between the conductive contact structures 138.

Figure 3:
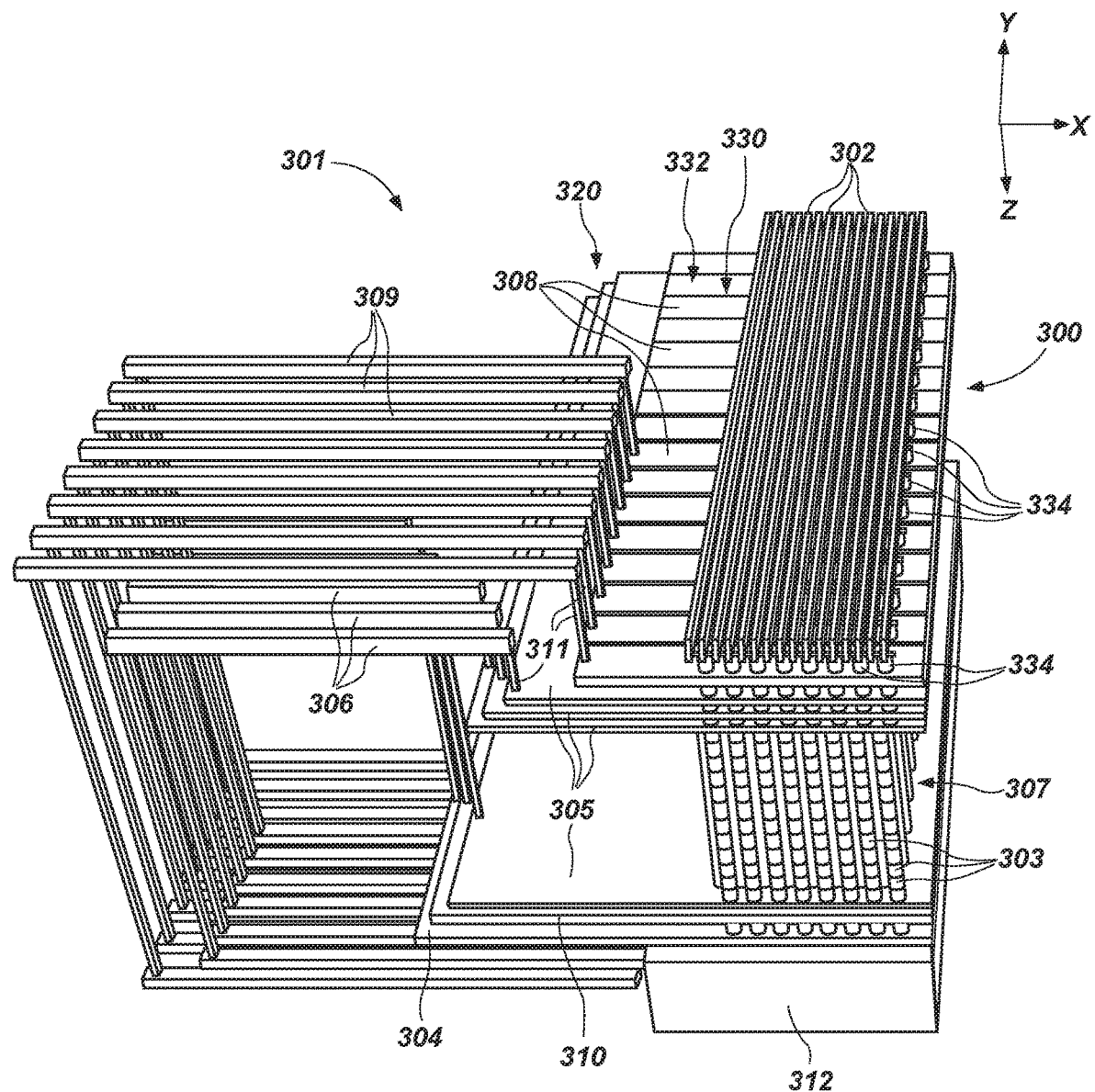
FIG. 3 is a partial cutaway perspective view of a microelectronic device, in accordance with embodiments of the disclosure.

FIG. 3 illustrates a partial cutaway perspective view of a portion of a microelectronic device 301 (e.g., a memory device, such as a dual deck 3D NAND Flash memory device) including a microelectronic device structure 300. The microelectronic device structure 300 may be substantially similar to the microelectronic device structures 100, 200 following the processing stages previously described with reference to FIG. 1H through FIG. 1J and with reference to FIG. 2C and FIG. 2D. As shown in FIG. 3, the microelectronic device structure 300 may include a staircase structure 320 (e.g., including the staircase structures 112 (FIG. 1H, FIG. 2C)) defining contact regions for connecting access lines 306 to conductive tiers 305 (e.g., conductive layers, conductive plates, such as the conductive structures 106 (FIG. 1H, FIG. 2C)). The microelectronic device structure 300 may include vertical strings 307 of memory cells 303 that are coupled to each other in series. The vertical strings 307 may extend vertically (e.g., in the Z-direction) and orthogonally to conductive lines and tiers 305, such as data lines 302, a source tier 304 (e.g., the source structure 110 (FIG. 1H, FIG. 2C)), the conductive tiers 305, the access lines 306, first select gates 308 (e.g., upper select gates, drain select gates (SGDs)), select lines 309, and a second select gate 310 (e.g., a lower select gate, a source select gate (SGS)). The select gates 308 may be horizontally divided (e.g., in the Y-direction) into multiple blocks 332 (e.g., block structures 124 (FIG. 1I, FIG. 2D)) horizontally separated (e.g., in the Y-direction) from one another by slot structures 330 (e.g., slot structures 122 (FIG. 1I, FIG. 2D)).

Vertical conductive contacts 311 (e.g., conductive contact structures 138 (FIG. 1H, FIG. 2C)) may electrically couple components to each other as shown. For example, the select lines 309 may be electrically coupled to the first select gates 308 and the access lines 306 may be electrically coupled to the conductive tiers 305. The microelectronic device 301 may also include a control unit 312 positioned under the memory array, which may include control logic devices configured to control various operations of other features (e.g., the vertical strings 307 of memory cells 303) of the microelectronic device 301. By way of non-limiting example, the control unit 312 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), \Tad regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 312 may be electrically coupled to the data lines 302, the source tier 304, the access lines 306, the first select gates 308, and the second select gates 310, for example. In some embodiments, the control unit 312 includes CMOS (complementary metal-oxide-semiconductor) circuitry. In such embodiments, the control unit 312 may be characterized as having a "CMOS under Array" ("CuA") configuration.

The first select gates 308 may extend horizontally in a first direction (e.g., the X-direction) and may be coupled to respective first groups of vertical strings 307 of memory cells 303 at a first end (e.g., an upper end) of the vertical strings 307. The second select gate 310 may be formed in a substantially planar configuration and may be coupled to the vertical strings 307 at a second, opposite end (e.g., a lower end) of the vertical strings 307 of memory cells 303.

The data lines 302 (e.g., bit lines) may extend horizontally in a second direction (e.g., in the Y-direction) that is at an angle (e.g., perpendicular) to the first direction in which the first select gates 308 extend. The data lines 302 may be coupled to respective second groups of the vertical strings 307 at the first end (e.g., the upper end) of the vertical strings 307. A first group of vertical strings 307 coupled to a respective first select gate 308 may share a particular vertical string 307 with a second group of vertical strings 307 coupled to a respective data line 302. Thus, a particular vertical string 307 may be selected at an intersection of a particular first select gate 308 and a particular data line 302. Accordingly, the first select gates 308 may be used for selecting memory cells 303 of the vertical strings 307 of memory cells 303.

The conductive tiers 305 (e.g., word line plates, such as the conductive structures 106 (FIG. 1H, FIG. 2C)) may extend in respective horizontal planes. The conductive tiers 305 may be stacked vertically, such that each conductive tier 305 is coupled to all of the vertical strings 307 of memory cells 303, and the vertical strings 307 of the memory cells 303 extend vertically through the stack of conductive tiers 305. The conductive tiers 305 may be coupled to or may form control gates of the memory cells 303 to which the conductive tiers 305 are coupled. Each conductive tier 305 may be coupled to one memory cell 303 of a particular vertical string 307 of memory cells 303.

The staircase structure 320 may be configured to provide electrical connection between the access lines 306 and the tiers 305 through the vertical conductive contacts 311. In other words, a particular level of the tiers 305 may be selected via an access line 306 in electrical communication with a respective conductive contact 311 in electrical communication with the particular tier 305.

The data lines 302 may be electrically coupled to the vertical strings 307 through conductive contact structure 334.

As described above, with reference to the microelectronic device structure 100, 200, an insulative material (e.g., the first insulative material 116 (FIG. 1H, FIG. 2C)) may provide electrical isolation between neighboring conductive contacts 311. In addition, a second insulative material (e.g., the second insulative material 134 (FIG. 1H, FIG. 2C)) may electrically isolate neighboring conductive contacts 311.

Figure 4:
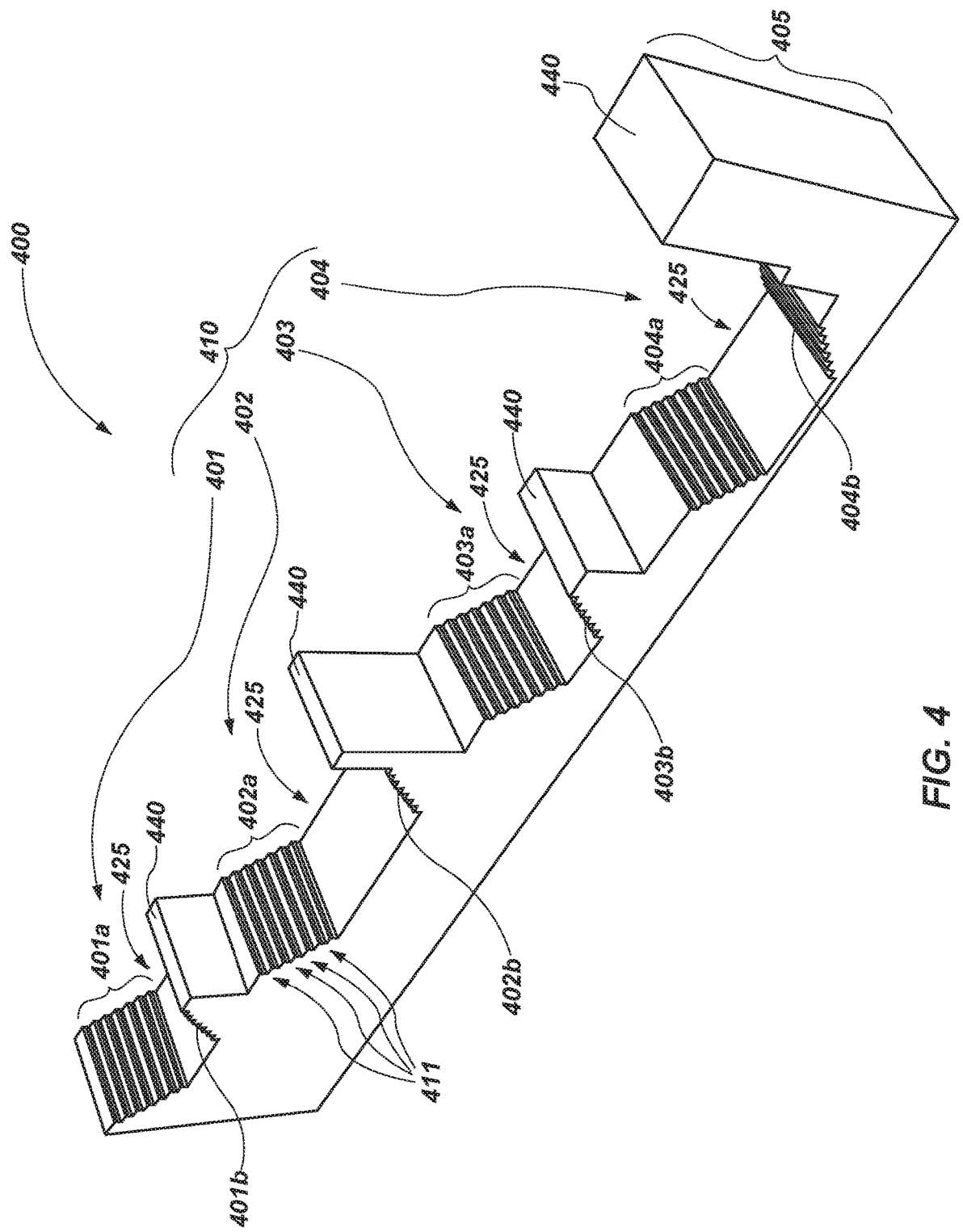
FIG. 4 is a simplified perspective view of a microelectronic device structure of the microelectronic device shown in FIG. 3, in accordance with embodiments of the disclosure

FIG. 4 is a simplified perspective view of a microelectronic device structure 400, in accordance with embodiments of the disclosure. The microelectronic device structure 400 may, for example, be employed as the microelectronic device structure 300 of the microelectronic device 301 previously described with reference to FIG. 3 or the microelectronic device structures 100, 200 previously described with reference to FIG. 1H through FIG. 1J or FIG. 2C and FIG. 2D. As shown in FIG. 4, the microelectronic device structure 400 may include a stack structure 405 (e.g., stack structure 102 (FIG. 1H, FIG. 2C)) of vertically alternating conductive structures and insulative structures. The microelectronic device structure 400 may include one or more staircase structures 410 (e.g., staircase structures 112 (FIG. 1H, FIG. 2C) or staircase structures 320 (FIG. 3)). Steps 411 of the staircase structure(s) 410 of the microelectronic device structure 400 may serve as contact regions for different tiers (e.g., conductive tiers 305 (FIG. 3)) of conductive materials (e.g., conductive structures 106 (FIG. 1H, FIG. 2C) of the stack structure 405. The steps 411 may be located at horizontal ends of conductive structures (e.g., the conductive tiers 305) and insulative structures located between neighboring conductive structures.

The staircase structure(s) 410 may include, for example, a first stadium structure 401, a second stadium structure 402, a third stadium structure 403, and a fourth stadium structure 404. Each of the first stadium structure 401, the second stadium structure 402, the third stadium structure 403, and the fourth stadium structure 404 may include steps 411 at different elevations (e.g., vertical positions) relative to steps 411 of the other of the first stadium structure 401, the second stadium structure 402, the third stadium structure 403, and the fourth stadium structure 404. The first stadium structure 401 may include a first stair step structure 401a and an additional first stair step structure 401b; the second stadium structure 402 may include a second stair step structure 402a and an additional second stair step structure 402b; the third stadium structure 403 may include a third stair step structure 403a and an additional third stair step structure 403b; and the fourth stadium structure 404 may include a fourth stair step structure 404a and an additional fourth stair step structure 404b. The first stair step structure 401a, the second stair step structure 402a, the third stair step structure 403a, and the fourth stair step structure 404a may include steps 411 opposing and at the same elevation as the respective additional first stair step structure 401b, the additional second stair step structure 402b, the additional third stair step structure 403b, and the additional fourth stair step structure 404b. Each of the first stair step structure 401a, the second stair step structure 402a, the third stair step structure 403a, and the fourth stair step structure 404a may individually exhibit a generally negative slope; and each of the additional first stair step structure 401b, the additional second stair step structure 402b, the additional third stair step structure 403b, and the additional fourth stair step structure 404b may individually exhibit a generally positive slope.

As shown in FIG. 4, a valley 425 may be located between the first stair step structure 401a and the additional first stair step structure 401b; between the second stair step structure 402a and the additional second stair step structure 402b; between the third stair step structure 403a and the additional third stair step structure 403b; and between the fourth stair step structure 404a and the additional fourth stair step structure 404b. in some embodiments, the valleys 425 may be filled with a first insulative material (e.g., the first insulative material 116 (FIG. 1H, FIG. 2C)).

A region between neighboring stadium structures (e.g., the first stadium structure 401, the second stadium structure 402, the third stadium structure 403, and the fourth stadium structure 404) may comprise an elevated region 440, which may also be referred to as a so-called staircase or stair step "crest region".

As described above, conductive contact structures (e.g., the conductive contact structures 138 (FIG. 1H, FIG. 2C), vertical conductive contacts 311 (FIG. 3)) may be formed to the electrically conductive portion of each tier (e.g., each step 411) of the stack structure 405 of the microelectronic device structure 400. In some embodiments, one or more of the stadium structures 401, 402, 403, 404 may include a second insulative material (e.g., the second insulative material 134 (FIG. 1H, FIG. 2C)) electrically isolating neighboring conductive contact structures from each other. In some embodiments, only one of the stadium structures 401, 402, 403, 404 includes the first insulative material and the second insulative material and the other stadium structures 401, 402, 403, 404 include only the first insulative material. In other embodiments, more than one (e.g., two, three, all) of the stadium structures 401, 402, 403, 404 include the first insulative material and the second insulative material horizontally between neighboring conductive contact structures.

As will be understood by those of ordinary skill in the art, although the microelectronic device structure 200 (FIG. 3) and the microelectronic device structure 400 (FIG. 4) have been described as having particular structures, the disclosure is not so limited and the microelectronic device structures 300, 400 may have different geometric configurations and orientations.

Thus, in accordance with embodiments of the disclosure a microelectronic device comprises a stack structure comprising a vertically alternating sequence of conductive structures and insulative structures arranged in tiers, a staircase structure within the stack structure having steps comprising horizontal edges of the tiers, a first insulative material vertically overlying the staircase structure, conductive contact structures comprising a conductive material extending through the first insulative material and in contact with the steps of the staircase structure, and a second insulative material extending in a first horizontal direction between horizontally neighboring conductive contact structures and exhibiting one or more different properties than the first insulative material.

Thus, in accordance with additional embodiments of the disclosure, a microelectronic device comprises a stack structure comprising alternating conductive structures and insulative structures arranged in tiers, a stair step structure within the stack structure and having steps comprising horizontal ends of the tiers, support pillar structures extending through the stack structure, a first insulative material vertically overlying the stair step structure and defining a seam within the first insulative material, conductive contact structures extending through the first insulative material, each of the conductive contact structures in electrical communication with a step of the stair step structure, and isolation structures comprising a second insulative material extending through the first insulative material and at least partially filling the seam and electrically isolating horizontally neighboring conductive contact structures from each other.

Thus in accordance with further embodiments of the disclosure, a method of forming a microelectronic device comprises forming a first insulative material over a staircase structure in a stack structure comprising a vertically alternating sequence of conductive structures and insulative structures arranged in tiers, the first insulative material defining a seam extending in a first horizontal direction, forming support pillar structures through the stack structure, the seam between support pillar structures horizontally neighboring one another in a second horizontal direction, forming trenches through at least a portion of the first insulative material and exposing portions of the seam, filling at least a portion of the seam and the trenches with a second insulative material, and forming conductive contact structures through the first insulative material and in electrical communication with steps of the staircase structure, the first insulative material and the second insulative material electrically isolating the neighboring conductive contact structures from one another.

Figure 5:
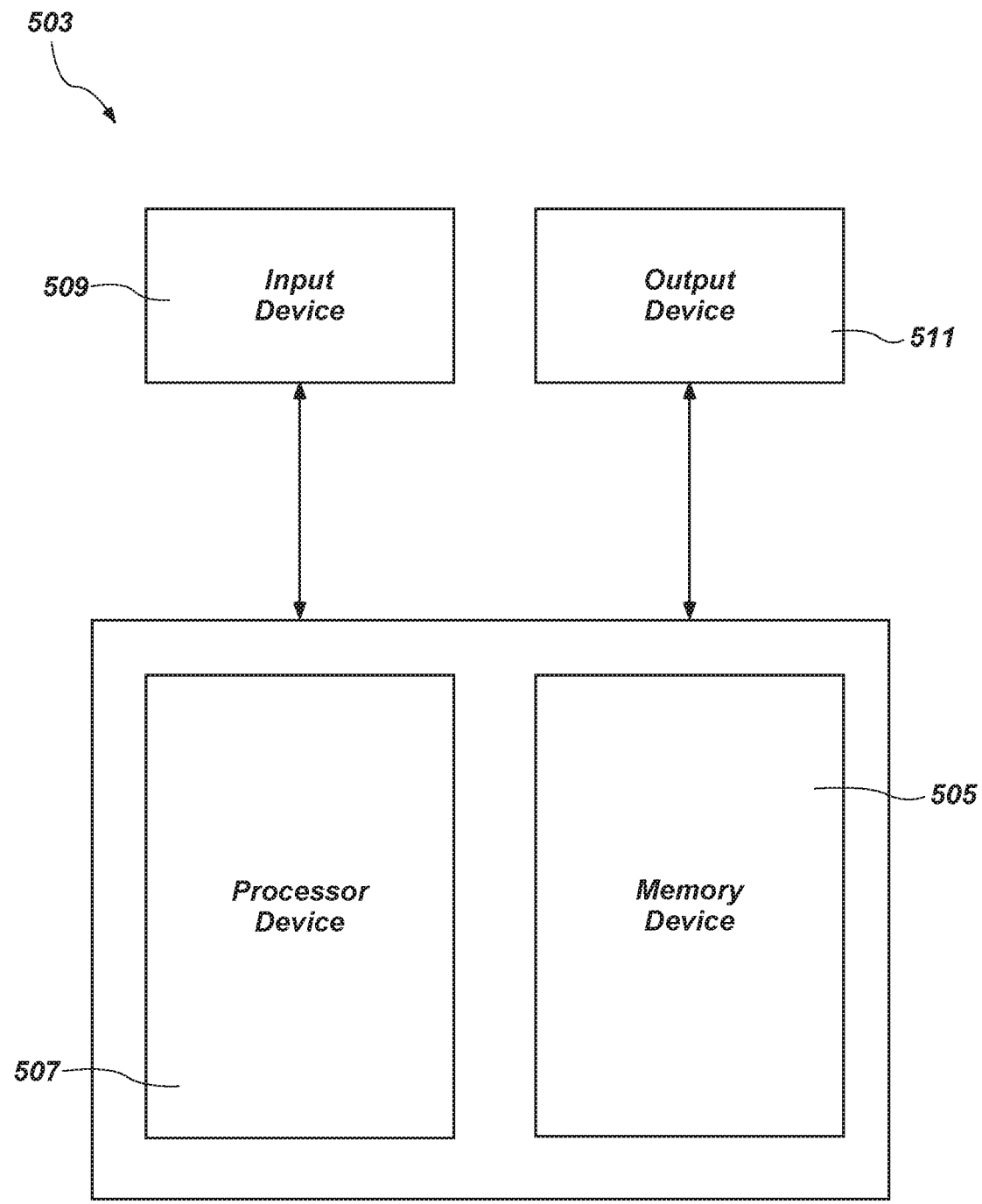
FIG. 5 is a block diagram of an electronic system, in accordance with embodiments of the disclosure.

Microelectronic devices (e.g., the microelectronic device 301 (FIG. 3)) and microelectronic device structures (e.g., the microelectronic device structures 100, 200, 300, 400) of the disclosures may be included in embodiments of electronic systems of the disclosure. For example, FIG. 5 is a block diagram of an electronic system 503, in accordance with embodiments of the disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 503 includes at least one memory device 505. The memory device 505 may include, for example, an embodiment one or more of a microelectronic device structure herein (e.g., the microelectronic device structure 100, 200, 300, 400) and a microelectronic device (e.g., the microelectronic device 301) previously described herein.

The electronic system 503 may further include at least one electronic signal processor device 507 (often referred to as a "microprocessor"). The electronic signal processor device 507 may, optionally, include an embodiment of one or more of a microelectronic device and a microelectronic device structure previously described herein. The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, a monitor, a display, a printer, an audio output jack, a speaker, etc. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507.

Figure 6:
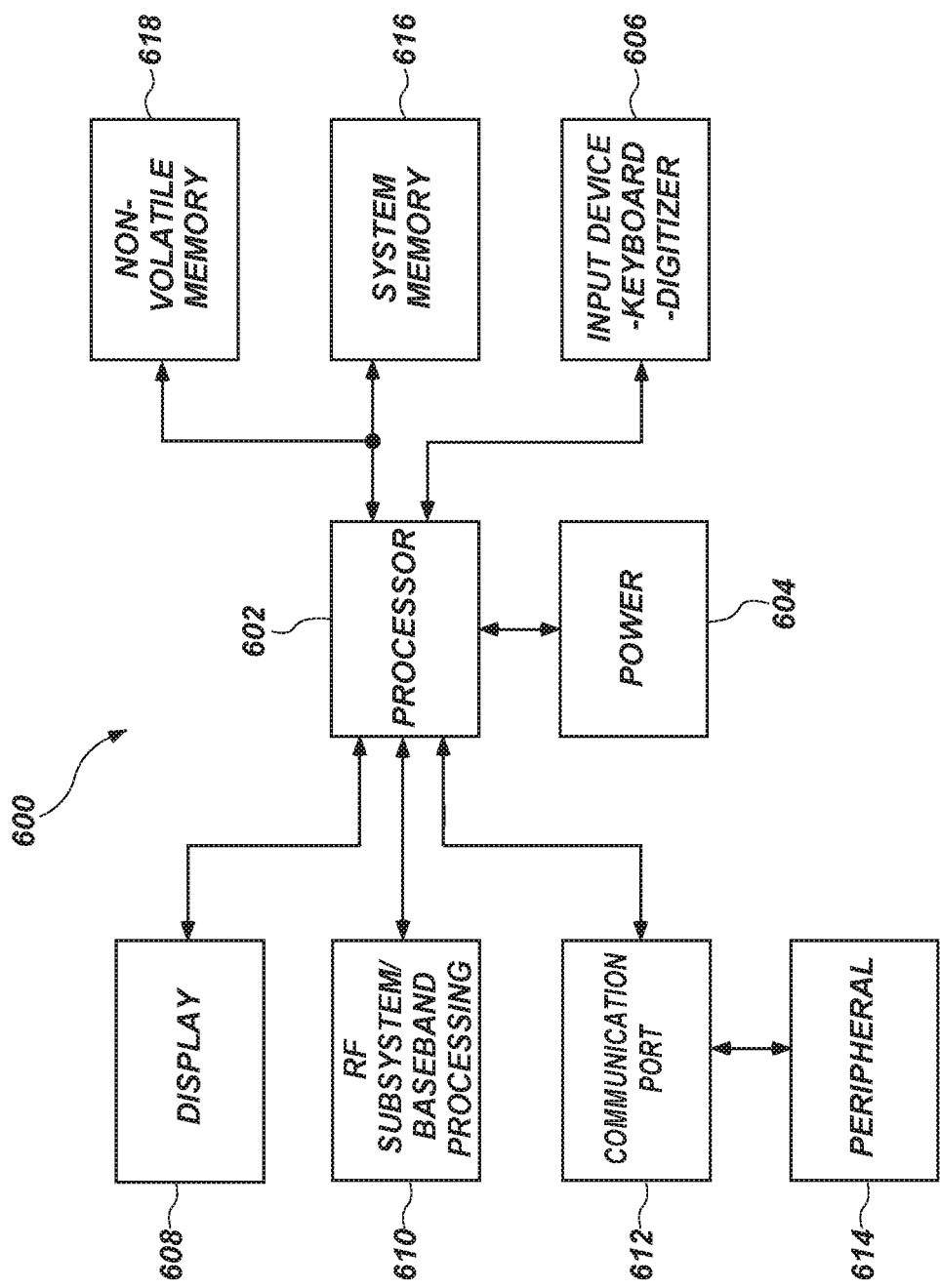
FIG. 6 is a block diagram of a processor-based system, in accordance with embodiments of the disclosure.

With reference to FIG. 6, depicted is a processor-based system 600. The processor-based system 600 may include one or more of a microelectronic device and a microelectronic device structure previously described herein and manufactured in accordance with embodiments of the disclosure. The processor-based system 600 may be any of a variety of types such as a computer, pager, cellular phone, personal organizer, control circuit, or other electronic device. The processor-based system 600 may include one or more processors 602, such as a microprocessor, to control the processing of system functions and requests in the processor-based system 600. The processor 602 and other subcomponents of the processor-based system 600 may include one or more of a microelectronic device and a microelectronic device structure previously described herein and manufactured in accordance with embodiments of the present disclosure.

The processor-based system 600 may include a power supply 604 in operable communication with the processor 602. For example, if the processor-based system 600 is a portable system, the power supply 604 may include one or more of a fuel cell, a power scavenging device, permanent batteries, replaceable batteries, and rechargeable batteries. The power supply 604 may also include an AC adapter; therefore, the processor-based system 600 may be plugged into a wall outlet, for example. The power supply 604 may also include a DC adapter such that the processor-based system 600 may be plugged into a vehicle cigarette lighter or a vehicle power port, for example.

Various other devices may be coupled to the processor 602 depending on the functions that the processor-based system 600 performs. For example, a user interface 606 may be coupled to the processor 602. The user interface 606 may include input devices such as buttons, switches, a keyboard, a light pen, a mouse, a digitizer and stylus, a touch screen, a voice recognition system, a microphone, or a combination thereof. A display 608 may also be coupled to the processor 602. The display 608 may include an LCD display, an SED display, a CRT display, a DLP display, a plasma display, an OLED display, an LED display, a three-dimensional projection, an audio display, or a combination thereof. Furthermore, an RF sub-system/baseband processor 610 may also be coupled to the processor 602. The RF sub-system/baseband processor 610 may include an antenna that is coupled to an RF receiver and to an RF transmitter (not shown). A communication port 612, or more than one communication port 612, may also be coupled to the processor 602. The communication port 612 may be adapted to be coupled to one or more peripheral devices 614, such as a modem, a printer, a computer, a scanner, or a camera, or to a network, such as a local area network, remote area network, intranet, or the Internet, for example.

The processor 602 may control the processor-based system 600 by implementing software programs stored in the memory. The software programs may include an operating system, database software, drafting software, word processing software, media editing software, or media playing software, for example. The memory is operably coupled to the processor 602 to store and facilitate execution of various programs. For example, the processor 602 may be coupled to system memory 616, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 616 may include volatile memory, non-volatile memory, or a combination thereof. The system memory 616 is typically large so that it can store dynamically loaded applications and data. In some embodiments, the system memory 616 may include semiconductor devices, such as one or more of a microelectronic devices and a microelectronic device structure previously described herein.

The processor 602 may also be coupled to non-volatile memory 618, which is not to suggest that system memory 616 is necessarily volatile. The non-volatile memory 618 may include one or more of STT-MRAM, MRAM, read-only memory (ROM) such as an EPROM, resistive read-only memory (RROM), and flash memory to be used in conjunction with the system memory 616. The size of the non-volatile memory 618 is typically selected to be just large enough to store any necessary operating system, application programs, and fixed data. Additionally, the non-volatile memory 618 may include a high-capacity memory such as disk drive memory, such as a hybrid-drive including resistive memory or other types of non-volatile solid-state memory, for example. The non-volatile memory 618 may include microelectronic devices, such as one or more of a microelectronic device and a microelectronic device structure previously described herein.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises a staircase structure within a stack structure comprising a vertically alternating sequence of conductive structures and insulative structures arranged in tiers, a first insulative material vertically overlying the staircase structure, support pillar structures extending through the stack structure, the support pillar structures arranged in columns and rows, and isolation structures comprising a second insulative material, the isolation structures located between a first column of the columns of the support pillar structures and a second column of the columns of the support pillar structures, a portion of the isolation structures extending horizontally between a support pillar structure of the first column and a support pillar structure of the second column, the isolation structures comprising a second insulative material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising a vertically alternating sequence of conductive structures and insulative structures arranged in tiers;
   a staircase structure within the stack structure having steps comprising horizontal edges of the tiers;
   a first insulative material vertically overlying the staircase structure;
   conductive contact structures comprising a conductive material extending through the first insulative material and in contact with the steps of the staircase structure;
   a second insulative material extending in a first horizontal direction between horizontally neighboring conductive contact structures and exhibiting one or more different properties than the first insulative material; and
   isolation structures comprising the second insulative material and extending partially into the stack structure between the horizontally neighboring conductive contact structures, the isolation structures exhibiting a vertical height greater than the a vertical height of the second insulative material extending in the first horizontal direction between horizontally neighboring conductive contact structures.

2. The microelectronic device of claim 1, further comprising support pillar structures extending through the stack structure and spaced from the conductive contact structures, the support pillar structures horizontally offset from the conductive contact structures in the first horizontal direction and a second horizontal direction.

3. The microelectronic device of claim 2, wherein the second insulative material horizontally extends in the second horizontal direction between horizontally neighboring support pillar structures.

4. The microelectronic device of claim 3, wherein the horizontally neighboring support pillar structures comprise a recessed portion proximate the second insulative material.

5. The microelectronic device of claim 1, wherein the second insulative material comprises a different material composition than the first insulative material.

6. The microelectronic device of claim 1, wherein the isolation structures extend into the stack structure a depth within a range from about 150 nm to about 190 nm.

7. The microelectronic device of claim 1, further comprising conductive material in electrical communication with the horizontally neighboring conductive contact structures and extending in the first horizontal direction, the conductive material in electrical communication with horizontally neighboring conductive contact structures spaced from each other by the second insulative material.

8. A microelectronic device, comprising:
   a stack structure comprising alternating conductive structures and insulative structures arranged in tiers;
   a stair step structure within the stack structure and having steps comprising horizontal ends of the tiers;
   support pillar structures extending through the stack structure;
   a first insulative material vertically overlying the stair step structure and defining a seam within the first insulative material;
   conductive contact structures extending through the first insulative material, each of the conductive contact structures in electrical communication with a step of the stair step structure; and
   isolation structures comprising a second insulative material extending through the first insulative material and at least partially filling the seam and electrically isolating horizontally neighboring conductive contact structures from each other.

9. The microelectronic device of claim 8, wherein the second insulative material exhibits a different density than the first insulative material.

10. The microelectronic device of claim 8, wherein the seam is located vertically above an uppermost tier of the stack structure.

11. The microelectronic device of claim 8, wherein the seam is located vertically below an uppermost tier of the stack structure.

12. The microelectronic device of claim 8, further wherein the isolation structures extend vertically through the first insulative material.

13. The microelectronic device of claim 8, wherein the second insulative material extends horizontally between neighboring support pillar structures and horizontally between neighboring conductive contact structures.

14. The microelectronic device of claim 13, wherein the second insulative material extending horizontally between neighboring support pillar structures exhibits a rectangular shape.

15. A method of forming a microelectronic device, the method comprising:
    forming a first insulative material over a staircase structure in a stack structure comprising a vertically alternating sequence of conductive structures and insulative structures arranged in tiers, the first insulative material defining a seam extending in a first horizontal direction;
    forming support pillar structures through the stack structure, the seam between support pillar structures horizontally neighboring one another in a second horizontal direction;
    forming trenches through at least a portion of the first insulative material and exposing portions of the seam;
    filling at least a portion of the seam and the trenches with a second insulative material; and
    forming conductive contact structures through the first insulative material and in electrical communication with steps of the staircase structure, the first insulative material and the second insulative material electrically isolating neighboring conductive contact structures from one another.

16. The method of claim 15, wherein filling at least a portion of the seam and the trenches with a second insulative material comprises filling the at least a portion of the seam and the trenches with the second insulative material by atomic layer deposition.

17. The method of claim 15, wherein forming trenches through at least a portion of the first insulative material comprises removing at least a portion of each support pillar structure of the horizontally neighboring support pillar structures.

18. The method of claim 15, wherein forming trenches through at least a portion of the first insulative material comprises removing at least some tungsten from the horizontally neighboring support pillar structures.

19. The method of claim 15, wherein forming trenches through at least a portion of the first insulative material comprises exposing at least a portion of the seam through the trenches.

20. The method of claim 15, wherein filling at least a portion of the seam and the trenches with a second insulative material comprises filling at least a portion of the seam and the trenches with a second insulative material exhibiting one or more different properties than the first insulative material.

21. The method of claim 15, wherein forming support pillar structures through the stack structure comprises forming additional support pillar structures spaced from the seam by one of the horizontally neighboring support pillar structures.

22. An electronic system, comprising:
    an input device;
    an output device;
    a processor device operably coupled to the input device and the output device; and
    a memory device operably coupled to the processor device and comprising at least one microelectronic device structure, the at least one microelectronic device structure comprising:
        a staircase structure within a stack structure comprising a vertically alternating sequence of conductive structures and insulative structures arranged in tiers;
        a first insulative material vertically overlying the staircase structure;
        support pillar structures extending through the stack structure, the support pillar structures arranged in columns and rows; and
        isolation structures comprising a second insulative material, the isolation structures located between a first column of the columns of the support pillar structures and a second column of the columns of the support pillar structures, a portion of the isolation structures extending horizontally between a support pillar structure of the first column and a support pillar structure of the second column, the isolation structures within the first insulative material and vertically extending at least partially into the first insulative material.

23. The electronic system of claim 22, further comprising conductive contact structures in electrical communication with the conductive structures of the stack structure.

24. The electronic system of claim 23, wherein the isolation structures extend between horizontally neighboring conductive contact structures.

25. The electronic system of claim 22, wherein vertical sidewalls of the isolation structures are tapered.

* * * * *

UNITED STATES PATENT AND TRADEMARK OFFICE
CERTIFICATE OF CORRECTION

PATENT NO. : 11,637,178 B2
APPLICATION NO. : 17/078755
DATED : April 25, 2023
INVENTOR(S) : Shuangqiang Luo, Indra V. Chary and Harsh Narendrakumar Jain It is certified that error appears in the above-identified patent and that said Letters Patent is hereby corrected as shown below:

In the Specification

| | | |
|---|---|---|
| Column 9, | Line 19, | change "about 20.0" to --about 20.0 µm-- |
| Column 9, | Line 19, | change "about 10.0" to --about 10.0 µm-- |
| Column 9, | Line 20, | change "about 15.0" to --about 15.0 µm-- |
| Column 9, | Line 21, | change "about 20.0" to --about 20.0 µm-- |
| Column 9, | Line 21, | change "about 13.5" to --about 13.5 µm-- |
| Column 10, | Line 12, | change "multiple blocks" to --multiple block-- |
| Column 10, | Line 44, | change "blocks structures" to --block structures-- |
| Column 12, | Line 47, | change "comprises Sift." to --comprises $SiO_2$.-- |
| Column 18, | Line 1, | change "\Tad regulators," to --$V_{dd}$ regulators,-- |

Signed and Sealed this
Thirteenth Day of February, 2024

Katherine Kelly Vidal
*Director of the United States Patent and Trademark Office*